(12) United States Patent
Kibi

(10) Patent No.: US 11,282,753 B2
(45) Date of Patent: Mar. 22, 2022

(54) METHOD OF SIMULTANEOUSLY FORMING CONTACTS TO A POWER RAIL AND THE SOURCE AND DRAIN REGIONS OF A FINFET

(71) Applicant: Tokyo Electron Limited, Tokyo (JP)

(72) Inventor: Kazuo Kibi, Tokyo (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/963,362

(22) PCT Filed: Jan. 21, 2019

(86) PCT No.: PCT/JP2019/001682
§ 371 (c)(1),
(2) Date: Jul. 20, 2020

(87) PCT Pub. No.: WO2019/151018
PCT Pub. Date: Aug. 8, 2019

(65) Prior Publication Data
US 2020/0365468 A1    Nov. 19, 2020

(30) Foreign Application Priority Data
Feb. 2, 2018 (JP) .............................. JP2018-017507

(51) Int. Cl.
*H01L 21/8238* (2006.01)
*H01L 21/02* (2006.01)
(Continued)

(52) U.S. Cl.
CPC .. *H01L 21/823871* (2013.01); *H01L 21/0217* (2013.01); *H01L 21/02115* (2013.01);
(Continued)

(58) Field of Classification Search
None
See application file for complete search history.

(56) References Cited

U.S. PATENT DOCUMENTS

2017/0062421 A1    3/2017  Cosemans et al.
2017/0141199 A1*   5/2017  Demuynck ....... H01L 21/02178
(Continued)

FOREIGN PATENT DOCUMENTS

JP    H1050951 A    2/1998
JP    2001217407 A    8/2001
(Continued)

OTHER PUBLICATIONS

International Search Report issued in PCT/JP2019/001682; dated Mar. 26, 2019.

*Primary Examiner* — Erik Kielin
(74) *Attorney, Agent, or Firm* — Studebaker & Brackett PC

(57) ABSTRACT

In a method for manufacturing a semiconductor device that comprises a semiconductor fin including a source region and a drain region, which configure a field effect transistor, and a fixed potential line provided in parallel to the semiconductor fin, the method comprises: a first step of preparing an intermediate body in which an insulating layer is provided on the source region (P-type conductive region), the drain region (N-type conductive region), and the fixed potential line; and a second step of simultaneously forming contact holes leading to the source region, the drain region, and the fixed potential line, in the insulating layer.

6 Claims, 40 Drawing Sheets

(51) Int. Cl.
*H01L 21/311* (2006.01)
*H01L 27/092* (2006.01)
*H01L 29/417* (2006.01)

(52) U.S. Cl.
CPC ............... *H01L 21/31122* (2013.01); *H01L 21/823821* (2013.01); *H01L 27/0924* (2013.01); *H01L 29/41791* (2013.01)

(56) References Cited

U.S. PATENT DOCUMENTS

| | | | |
|---|---|---|---|
| 2018/0145030 A1* | 5/2018 | Beyne | H01L 21/823821 |
| 2019/0080969 A1* | 3/2019 | Tsao | H01L 21/823418 |
| 2019/0165177 A1* | 5/2019 | Chen | H01L 21/823431 |

FOREIGN PATENT DOCUMENTS

| | | | |
|---|---|---|---|
| JP | 2011151061 A | 8/2011 | |
| JP | 2015159284 A | 9/2015 | |

* cited by examiner

Fig.2

| Vin1 | Vin2 | Vin3 | Vout |
|------|------|------|------|
| L | L | L | H |
| L | L | H | H |
| L | H | L | H |
| L | H | H | H |
| H | L | L | H |
| H | L | H | H |
| H | H | L | H |
| H | H | H | L |

Fig.6
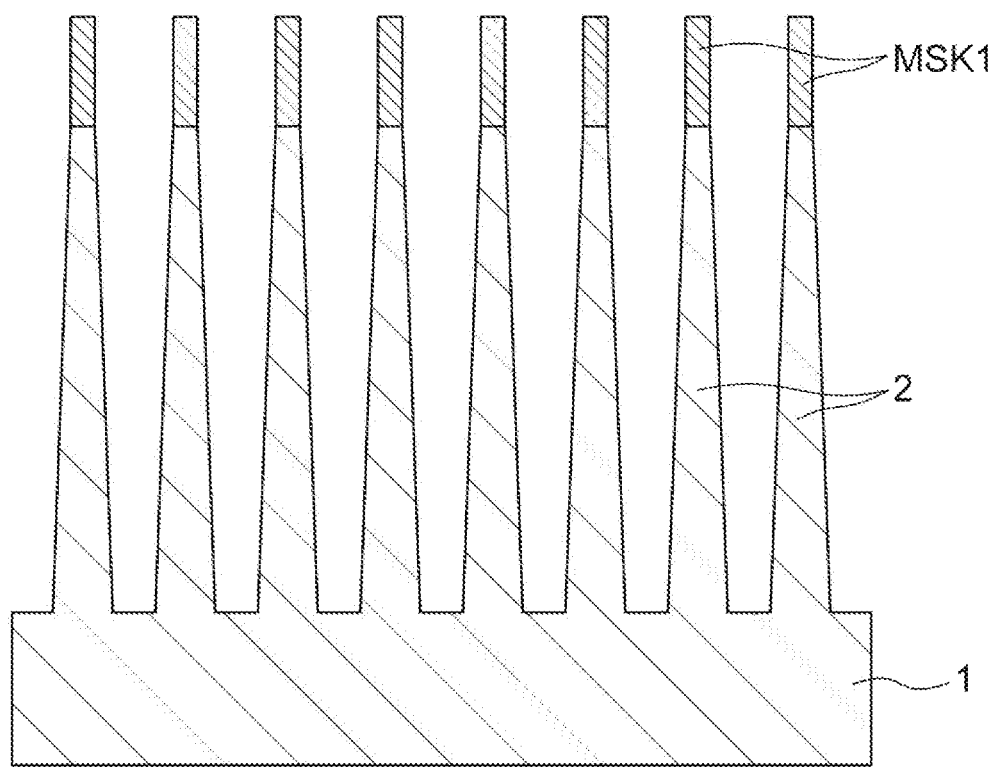
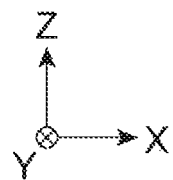

*Fig.8*
Y1 CROSS-SECTION
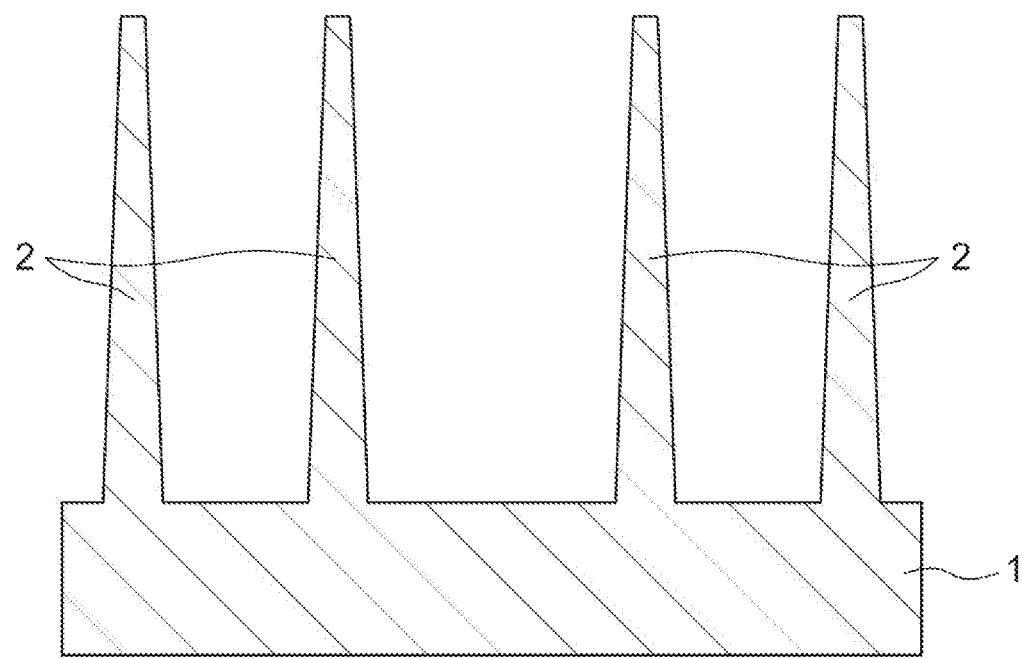
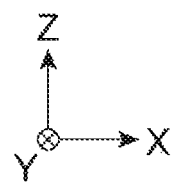

Y1 CROSS-SECTION

Y1 CROSS-SECTION

Y1 CROSS-SECTION

Fig.14
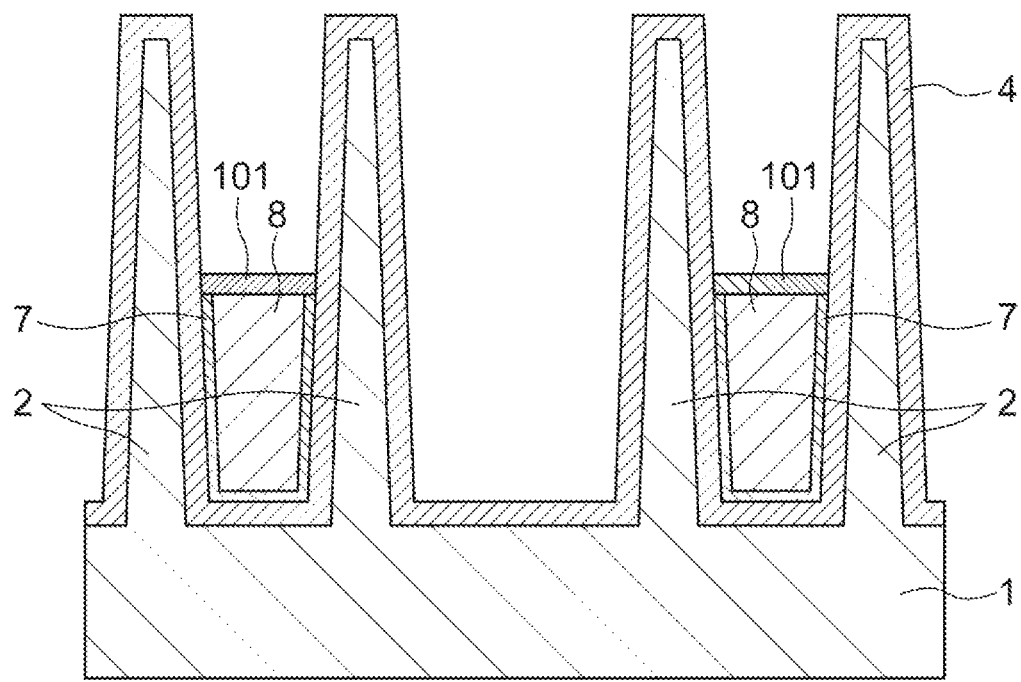
Y1 CROSS-SECTION
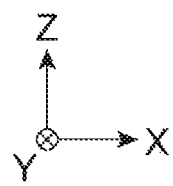

Y1 CROSS-SECTION

Y1 CROSS-SECTION

Y1 CROSS-SECTION

Y1 CROSS-SECTION

*Fig.27*
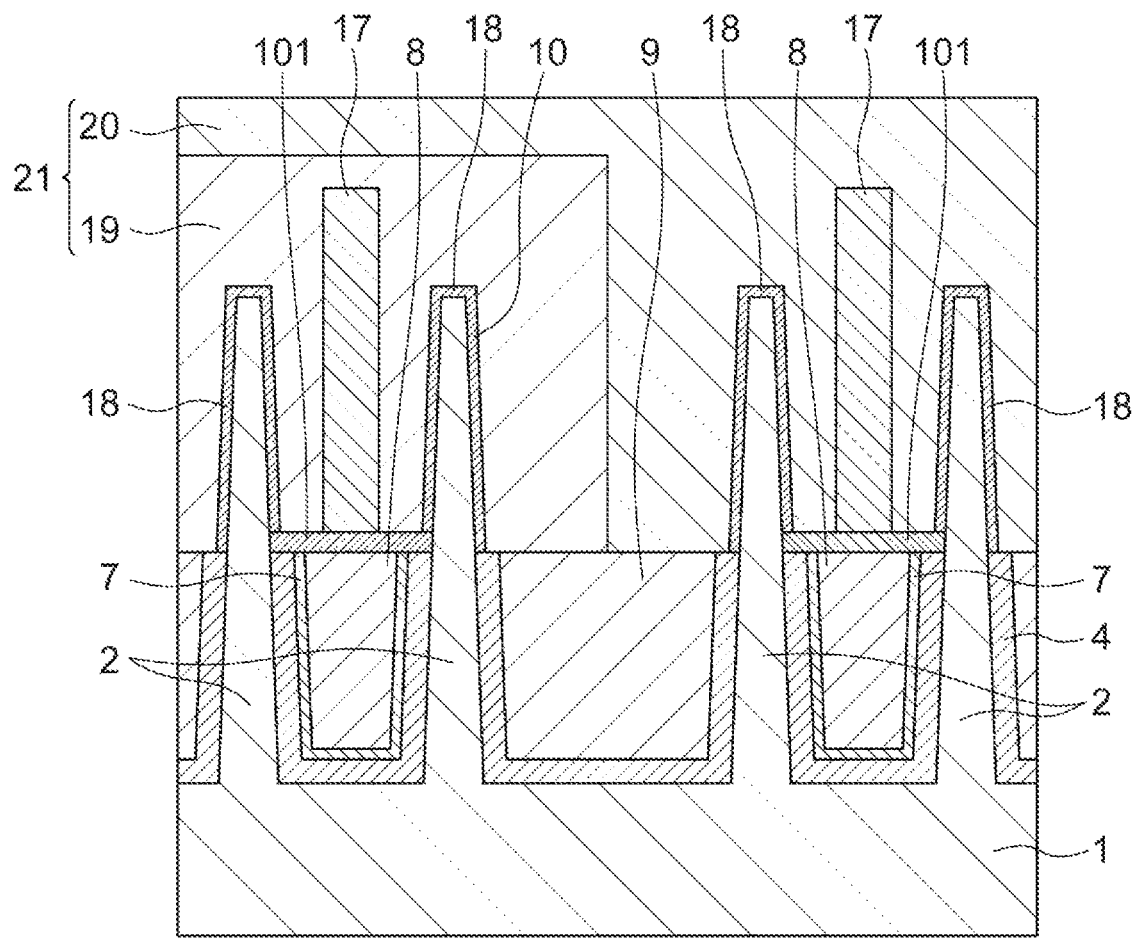
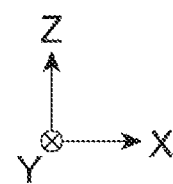

METHOD OF SIMULTANEOUSLY FORMING CONTACTS TO A POWER RAIL AND THE SOURCE AND DRAIN REGIONS OF A FINFET

TECHNICAL FIELD

Exemplary embodiments of the present disclosure are related to semiconductor devices including fin-type field effect transistors (Fin-FET).

BACKGROUND ART

A logic standard cell in recent years is configured to include fin-type field effect transistors (hereinafter, referred to as FETs), and attempts have been made to reduce the minimum unit height (cell height) of a logic circuit. This is because if the cell height becomes smaller, power consumption decreases and the operation speed of the circuit increases, based on a scaling rule.

Patent Literature 1 discloses a structure in which power rails (power supply line/ground line) are embedded in a logic standard cell which includes fin-type FETs. The cell height is defined by the dimension between two power rails adjacent to each other. Another fin-type FET is disclosed in Patent Literature 4, for example.

Although it is not a fin-type FET, as related techniques, a technique for embedding a bit line of a memory is disclosed, and Patent Literatures 2 and 3 disclose capacitors.

CITATION LIST

Patent Literature

[Patent Literature 1] US Patent Application Publication No. 2017/0062421
[Patent Literature 2] Japanese Unexamined Patent Publication No. H10-50951
[Patent Literature 3] Japanese Unexamined Patent Publication No. 2001-217407
[Patent Literature 4] Japanese Unexamined Patent Publication No. 2015-159284

SUMMARY OF INVENTION

Technical Problem

However, in a semiconductor device that includes fin-type FETs, it is difficult to easily form a structure that includes a power rail (fixed potential line).

In a semiconductor device that includes fm-type FETs, there is a demand for a method for manufacturing a semiconductor device, in which it is possible to easily form a structure that includes a fixed potential line.

Solution to Problem

The first method for manufacturing a semiconductor device is directed to a method for manufacturing a semiconductor device that comprises a semiconductor fin including a source region and a drain region that forms a field effect transistor, and a fixed potential line provided in parallel to the semiconductor fin, and the first method comprises: a first step of preparing an intermediate body in which an insulating layer is provided on the source region, the drain region, and the fixed potential line; and a second step of simultaneously forming contact holes extending toward the source region, the drain region, and the fixed potential line, in the insulating layer.

According to this manufacturing method, by easily forming the contact hole, it is possible to simplify the manufacturing process. In the second step, the contact holes can be formed at the same time. In this case, the manufacturing throughput can be improved. That is, in the simultaneously forming of contact holes, the contact holes include a first contact hole and a second contact hole, the first contact hole extends toward the source region and the fixed potential line, the second contact hole extends toward the drain region, and the first contact hole and the second contact hole are formed at the same time.

The third method for manufacturing a semiconductor device further comprises forming contact electrodes in the contact holes, respectively. By forming the contact electrode in the contact hole, electrical conduction can be established between the elements located at both ends of the contact electrode.

In the fourth method for manufacturing a semiconductor device, the insulating layer comprises insulating layers including an amorphous carbon layer.

In the fifth method for manufacturing a semiconductor device, the insulating layer comprises at least a first nitride film, an amorphous carbon layer, and a second nitride film.

In the sixth method for manufacturing a semiconductor device, the second step of forming the contact holes includes etching the first nitride film and the amorphous carbon layer, and etching a part of the second nitride film.

In the seventh method for manufacturing a semiconductor device, the etching of the first nitride film and the amorphous carbon layer is performed by executing reactive ion etching (RIE), and the etching of a part of the second nitride film is performed by executing atomic layer etching.

In the eighth method for manufacturing a semiconductor device, the etching of the first nitride film and the amorphous carbon layer and the etching of a part of the second nitride film are executed in the same container.

Advantageous Effects of Invention

According to the exemplary embodiments, since the contact holes can be made easily, it is possible to make the transistor including a fixed potential line easily.

BRIEF DESCRIPTION OF DRAWINGS

FIG. 2 is a truth table of the logic standard cell.
FIG. 6 is a vertical sectional view of an intermediate body of the logic standard cell.
FIG. 8 is a vertical sectional view of the intermediate body of the logic standard cell.

FIG. 14 is a vertical sectional view of the intermediate body of the logic standard cell.

FIG. 27 is a vertical sectional view of the intermediate body of the logic standard cell.

DESCRIPTION OF EMBODIMENTS

Hereinafter, a semiconductor device that includes a fin-type field effect transistor (Fin-FET) and a method for manufacturing the same will be described. The same elements will be denoted by the same reference symbols, and overlapping description will be omitted.

Figure 1:
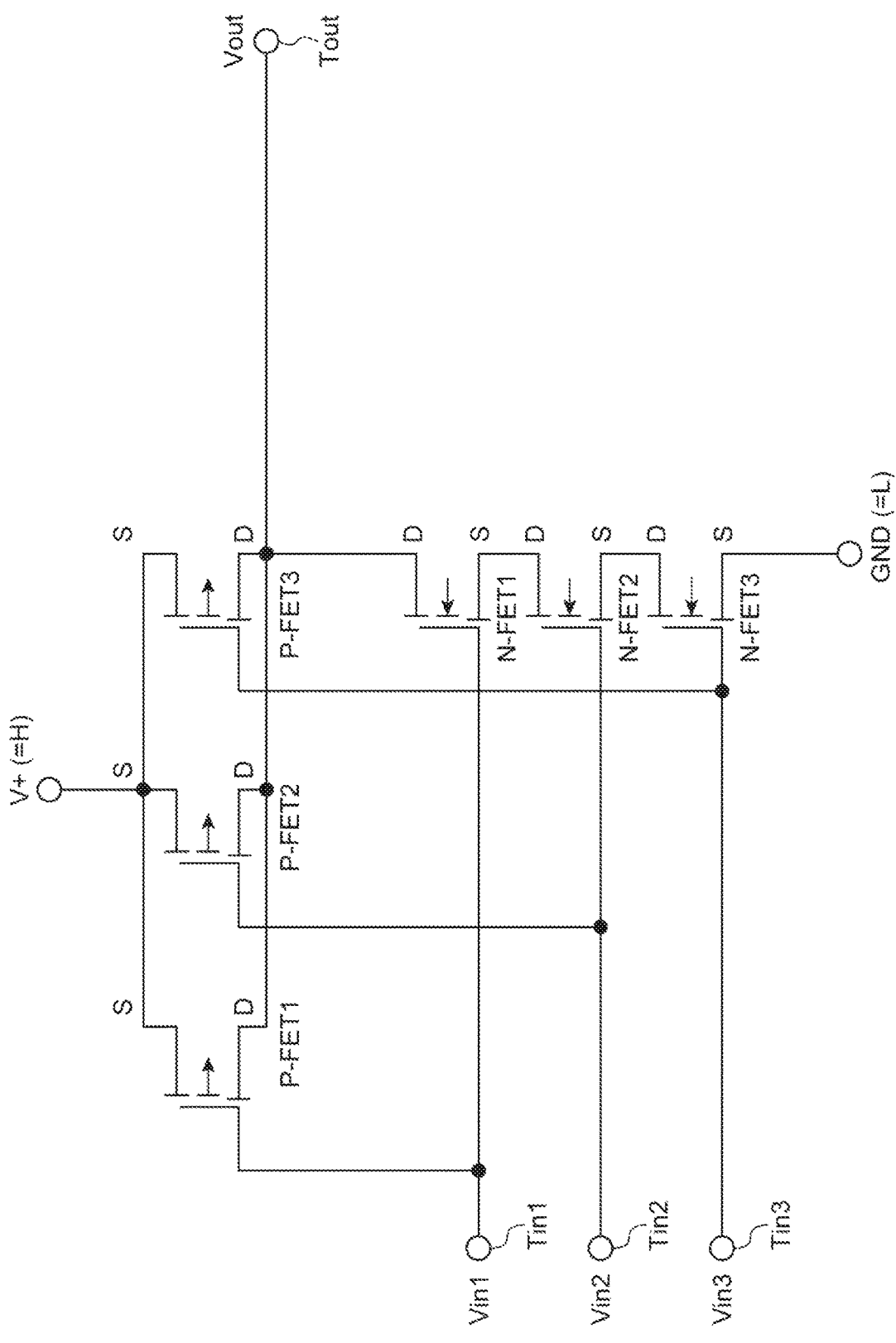
FIG. 1 is a circuit diagram of a logic standard cell.

FIG. 1 is a circuit diagram of a logic standard cell.

This logic circuit is a 3-input and 1-output NAND circuit. Input signals Vin1, Vin2, and Vin3 are voltage signals, and an output signal Vout is output from an output terminal Tout according to the input values to input terminals Tin1, Tin2, and Tin3 of the NAND circuit. The NAND circuit includes a first P-type FET (P-FET1), a second P-type FET (P-FET2), a third P-type FET (P-FET3), a first N-type FET. (N-FET1), a second N-type FET (N-FET2), and a third N-type FET (N-FET3). In the drawing, an enhancement type FET is shown. However, the FET may be a depletion type FET. The structure of the FET shown in the drawing is a MOS type. However, it is also possible to adopt a junction type FET.

In the NAND circuit, a source S of the P-type FET is electrically connected to a power source potential V, and a drain D is electrically connected to the output terminal Tout. In other words, the P-type FETs are connected in parallel between the terminals (power rails) that provide the power source potential V+ and a ground potential GND. The input terminals Tin1, Tin2, and Tin3 are respectively connected to the gates of the P-type FETs, so that the input signals Vin1, Vin2, and Vin3 are provided thereto.

The three N-type FETs are connected in series between the output terminal Tout and the ground potential GND. The source S of the N-type FET located at the bottom in the drawing is electrically connected to the ground potential GND. The input terminals Tin1, Tin2, and Tin3 are respectively connected to the gates of the N-type FETs, so that the input signals Vin1, Vin2, and Vin3 are provided thereto. This NAND circuit is composed of a complementary logic circuit (CMOS), and as the characteristic of the CMOS logic circuit, power consumption is suppressed.

FIG. 2 is a truth table of the logic standard cell.

The level of the output signal Vout is determined according to the voltage levels (H: high level, L: low level) of the input signals Vin1, Vin2, and Vin3. Since it is the NAND circuit, in a case where all the three input signals are at a high level, the output signal Vout becomes a low level, and in the case of other combinations, the output signal Vout becomes a high level.

Figure 3:
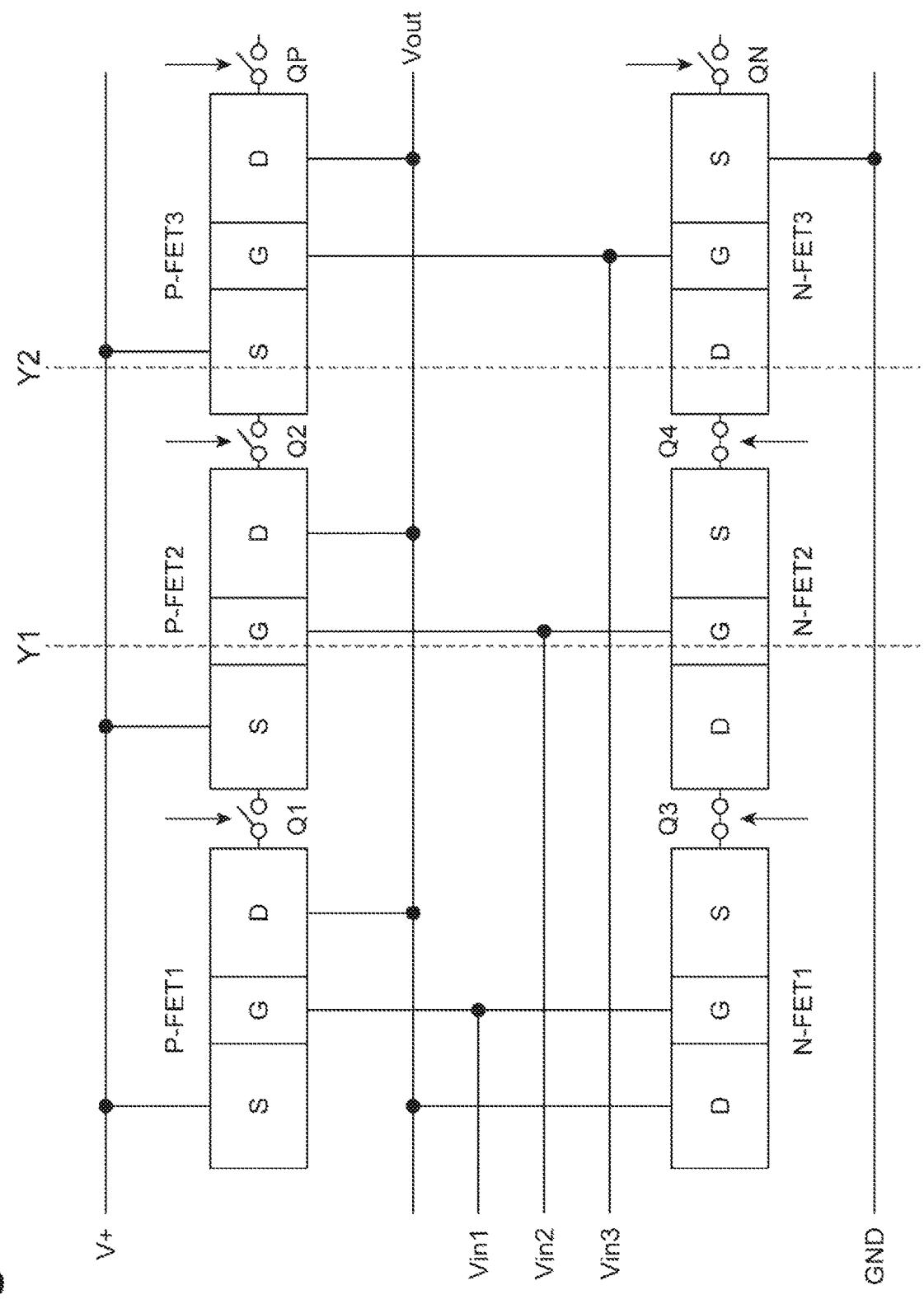
FIG. 3 is a circuit showing connection of FET groups in the logic standard cell.

FIG. 3 is a circuit showing the connection of FET groups in the logic standard cell.

Each FET includes a source S, a gate G and a drain D, and semiconductor regions corresponding to the respective elements (electrodes) are defined as a source region, a gate region, and a drain region. A source electrode is in contact with the source region, a gate electrode is provided on the gate region with an insulating film interposed therebetween, and a drain electrode is in contact with the drain region. The electrical connection is as shown in FIG. 1. However, in a case where the NAND circuit is composed of fin-type FETs, a first switch Q1 is interposed between the P-FET1 and the P-FET2, a second switch Q2 is interposed between the P-FET2 and the P-FET3, and a high level is applied to these switches (P-channel gates) to turn off these switches and prohibit the conduction between the transistors in the fin for the P-type FET. In the drawing, an additional switch QP (P-channel gate) is connected to the drain D of the P-FET3, and the drain D can be connected to another potential (for example, a reset potential), as necessary. However, the additional switch QP may be omitted.

On the other hand, a third switch Q3 is interposed between the N-FET1 and the N-FET2, a fourth switch Q4 is interposed between the N-FET2 and the N-FET3, and a high level is applied to these switches (N-channel gates) to turn off these switches and permit the conduction between the transistors in the fin for the N-type FET. In the drawing, an additional switch QN (N-channel gate) is connected to the source S of the N-FET3, and the source S can be connected to another potential (for example, a reset potential), as necessary. However, the additional switch QN may be omitted.

Figure 4:
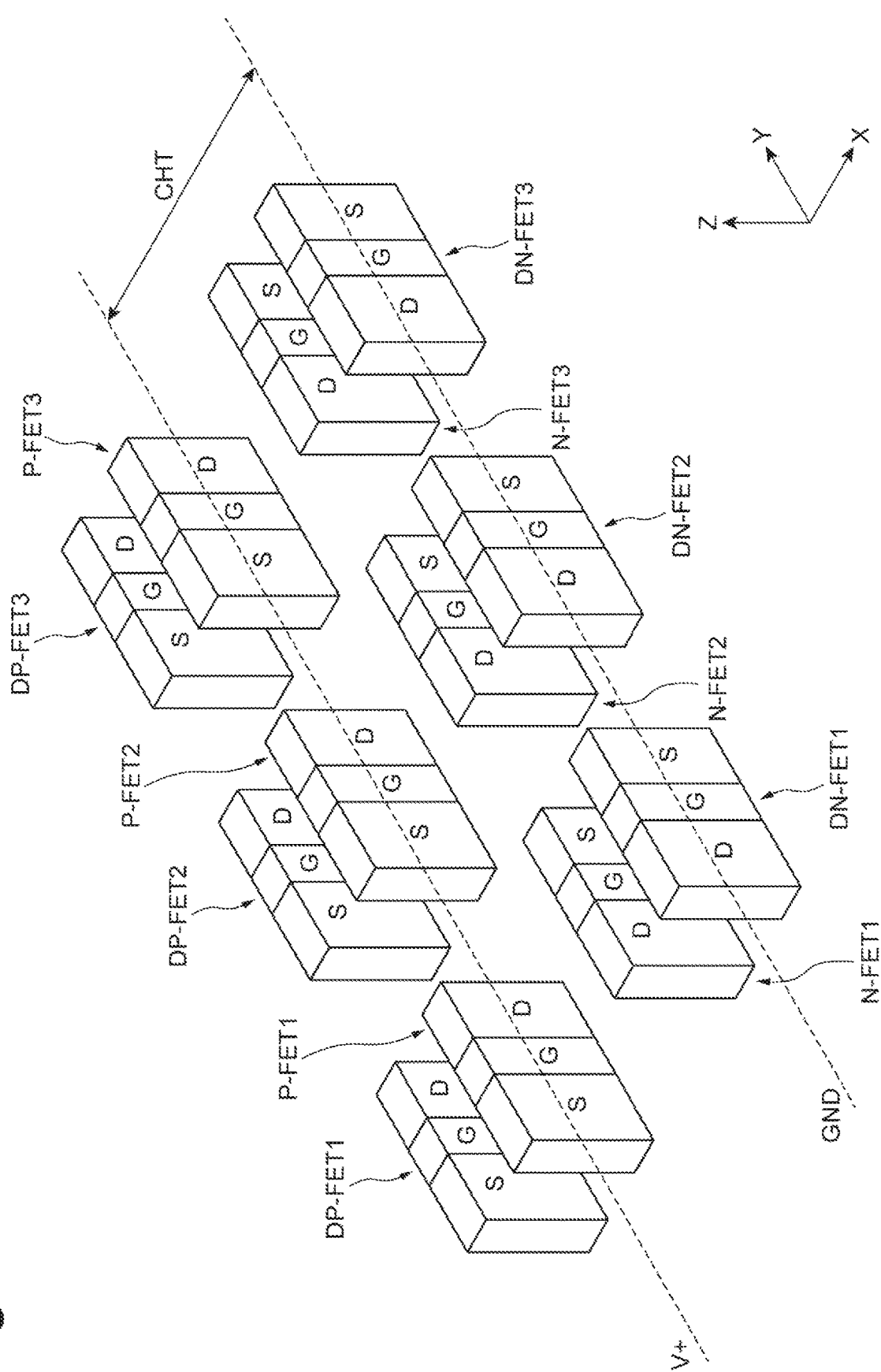
FIG. 4 is a perspective view of the FET groups in the logic standard cell.

FIG. 4 is a perspective view of the FET groups in the logic standard cell.

Each FET faces a dummy FET that pairs with the FET. That is, as the dummy FETs, a first P-type dummy FET (DP-FET1), a second P-type dummy FET (DP-FET2), and a third P-type dummy FET (DP-FET3) respectively face the P-FET1, the P-FET2, and the P-FET3. A fixed potential line (power source potential $V_+$) is disposed between these P-type FET pairs.

Similarly, as the dummy FETs, a first N-type dummy FET (DN-FET), a second N-type dummy FET (DN-FET2), and a third N-type dummy FET (DN-FET3) respectively face the N-FET1, the N-FET2, and the N-FET3. A fixed potential line (ground potential GND) is disposed between these N-type FET pairs.

In the description, an XYZ three-dimensional orthogonal coordinate system is set, the thickness direction of each layer in the laminated structure is set to be a Z-axis direction, and two axes orthogonal to the Z axis are set to be an X axis and a Y axis. A height direction of each fin is set to be a positive direction of the Z axis, a longitudinal direction is set to be a positive direction of the Y axis, and a width direction is set to be an X-axis direction. A cell height CHT is the distance between the center lines of the fixed potential lines (V+/GND) adjacently spaced apart along the X-axis direction, and in this example, it is assumed to be 120 nm or less.

Figure 5:
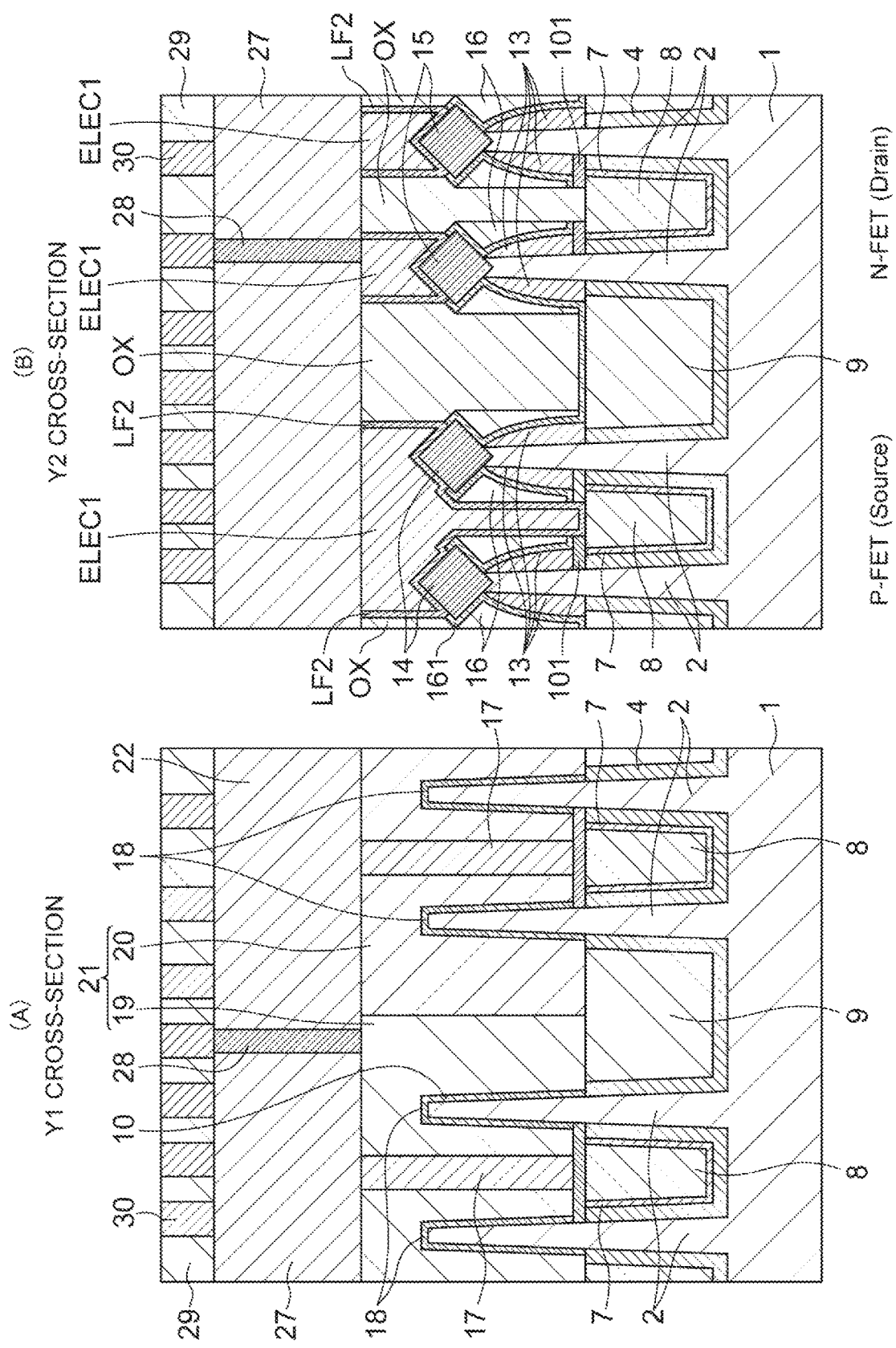
FIG. 5(A) is a vertical sectional view in the vicinity of a gate of a FET and FIG. 5(B) is a vertical sectional view in the vicinity of a source/drain of the FET.

FIG. 5-(A) is a vertical sectional view (Y1 cross-section) in the vicinity of the gate of the FET, and FIG. 5-(B) is a vertical sectional view (Y2 cross-section) in the vicinity of the source/drain of the FET.

In the vicinity of the gate in FIG. 5-(A), semiconductor fins 2 are provided on a semiconductor substrate 1, and conductive materials (7, 8) are embedded between these semiconductor fins 2. The conductive material 8 configures a fixed potential line and is applied with a power source potential or a ground potential. A gate electrode 21 is provided on the semiconductor fin 2 with a gate insulating film 18 interposed therebetween, an oxide film 27 and an interlayer insulating film 29 are deposited on the gate electrode 21, and the gate electrode 21 is connected to a specific signal wiring 30 through a contact electrode 28.

In the vicinity of the source/drain (Y2 cross-section) in FIG. 5-(B), semiconductor fins 2 are provided on the semiconductor substrate 1, a P-type conductive region 14 and an N-type conductive region 15 are formed on these semiconductor fins 2, the conductive region 14 (source region) on one side is electrically connected to the conductive material 8 through an electrode material ELEC1 (Ru), and the conductive region 15 (drain region) on the other side is electrically connected to the electrode material ELEC1 at another location, the oxide film 27 and the interlayer insulating film 29 are deposited on the electrode material ELEC1, and the drain region is connected to another signal wiring 30.

Hereinafter, a method for manufacturing the logic standard cell having the structure described above will be described.

Figure 7:
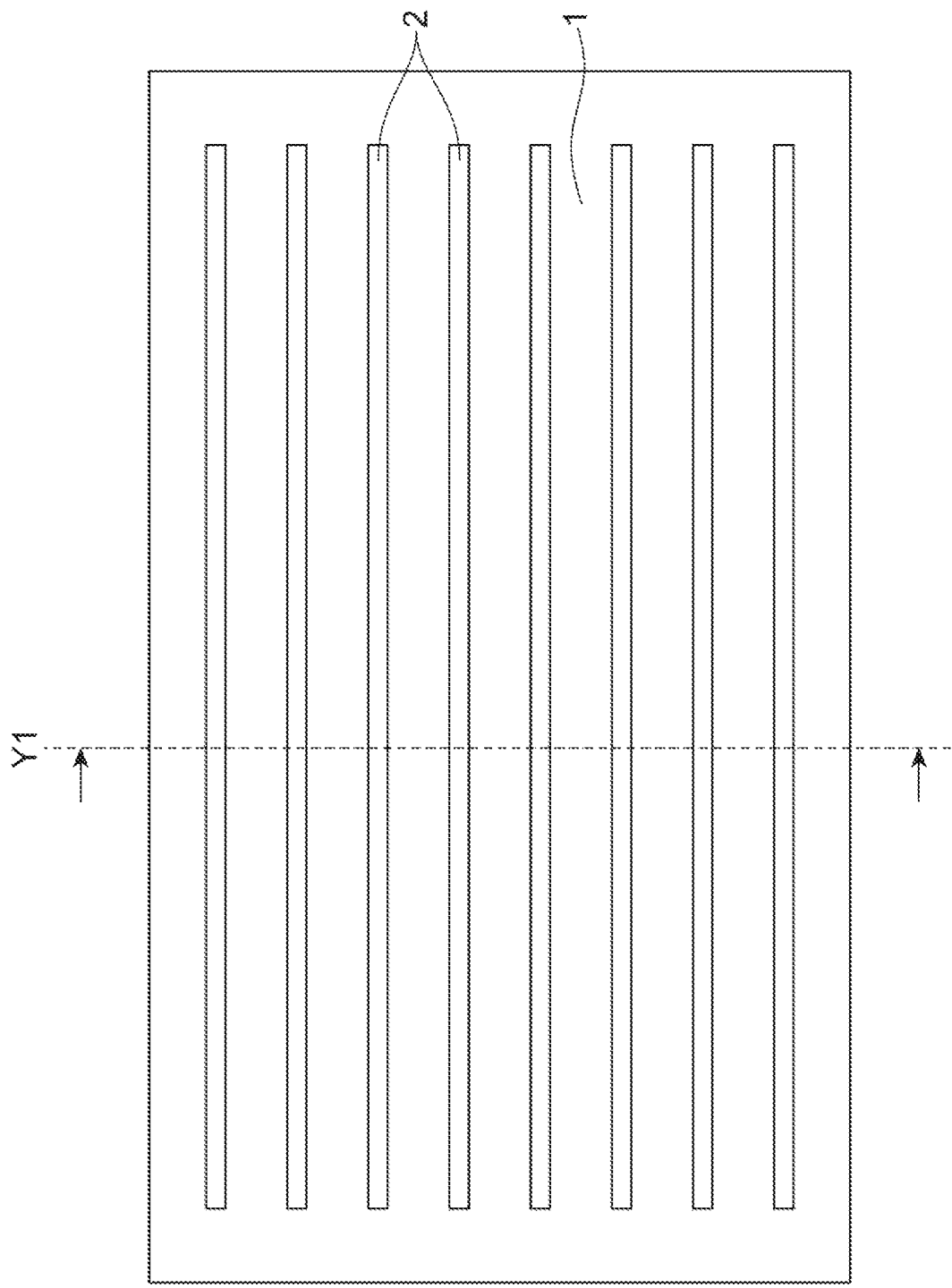
FIG. 7 is a plan view of the intermediate body of the logic standard cell.

FIG. 6 is a vertical sectional view of an intermediate body of the logic standard cell, and FIG. 7 is a plan view of the intermediate body of the logic standard cell. FIG. 6 is a vertical cross-section taken along the dotted line Y1 in FIG. 7. However, a mask MSK1 shown in FIG. 6 is omitted.

First, the semiconductor substrate 1 made of Si is prepared, a stripe-shaped mask MSK1 is patterned on the surface of the semiconductor substrate 1, and the semiconductor substrate 1 is etched through the mask MSK1. Photolithography using photoresist coating and development is used for the patterning of the mask.

The method of etching the semiconductor substrate (Si) is dry etching, and as an etching apparatus, a capacitively-coupled plasma (CCP) type etching apparatus can be adopted.

The specific conditions of the etching at this time are as follows.

Etching gas: $CF_4$
Etching temperature: 20 to 100° C.
Etching time: 10 to 60 sec As the etching gas, instead of $CF_4$, $O_2$, $N_2$, or $H_2$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

By the etching, the semiconductor fins 2 are left under the mask, and the plurality of semiconductor fins 2 are provided to be erected from the semiconductor substrate 1. The longitudinal direction of the stripe-shaped mask is the Y-axis direction, the distance between the centers of the semiconductor fins 2 adjacent to each other in the X-axis direction is 24 nm, and the height of the semiconductor fin 2 in the Z-axis direction is 120 nm. The width of the top surface of the semiconductor fin 2 in the X-axis direction is 8 nm, and the width of the bottom surface between the semiconductor fins 2 is 12 nm. The upper portion (a portion having a height of 50 nm from the top) of the semiconductor fin 2 configures a transistor, and the lower portion (a portion having a height of 70 nm from the bottom) functions as a sidewall adjacent to the fixed potential line. The depth of the semiconductor fin 2 in FIG. 8 in the Y-axis direction is set to 38 nm, for example. The dimensions in which it is possible to significantly reduce the power consumption are as described above. However, even if each dimension is changed by 10%, the power consumption can be reduced.

FIG. 8 is a vertical sectional view of the intermediate body of the logic standard cell.

After the plurality of semiconductor fins 2 are formed, the mask on the semiconductor fins 2 are removed by an organic solvent such as acetone, and subsequently, thinning of the semiconductor fins 2 is performed. That is, the second, fourth, fifth, and seventh semiconductor fins 2 from the left in FIG. 6 are removed. In this way, the first, third, sixth, and eighth semiconductor fins 2 from the left remain. The removal of the semiconductor fin 2 in FIG. 8 is performed as follows. First, a photoresist is applied onto the semiconductor substrate, and a mask which protects only the first, third, sixth, and eighth semiconductor fins 2 from the left and are open in the remaining regions is formed by the patterning of the photoresist by photolithography, and the semiconductor fins in the openings of the mask are etched. A dry etching method can be used for the etching.

The method of etching the semiconductor fin (Si) is dry etching, and as an etching apparatus, a capacitively-coupled plasma (CCP) type etching apparatus can be adopted.

The specific conditions of the etching at this time are as follows.

Etching gas: $CF_4$
Etching temperature: 20 to 100° C.
Etching time: 10 to 60 sec As the etching gas, instead of $CF_4$, $O_2$, $N_2$, or $H_2$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

Further, as the method of etching the semiconductor fin (Si), a wet etching method can also be used. As an etching liquid, $HNO_3$+HF, and KOH+IPA (isopropyl alcohol)+$H_2O_2$, or the like in a case of adjusting an etching rate are known, and for example, the etching temperature can be set to be in a range of 20 to 100° C., and the etching time can be set to be in a range of 10 to 60 sec.

Figure 9:
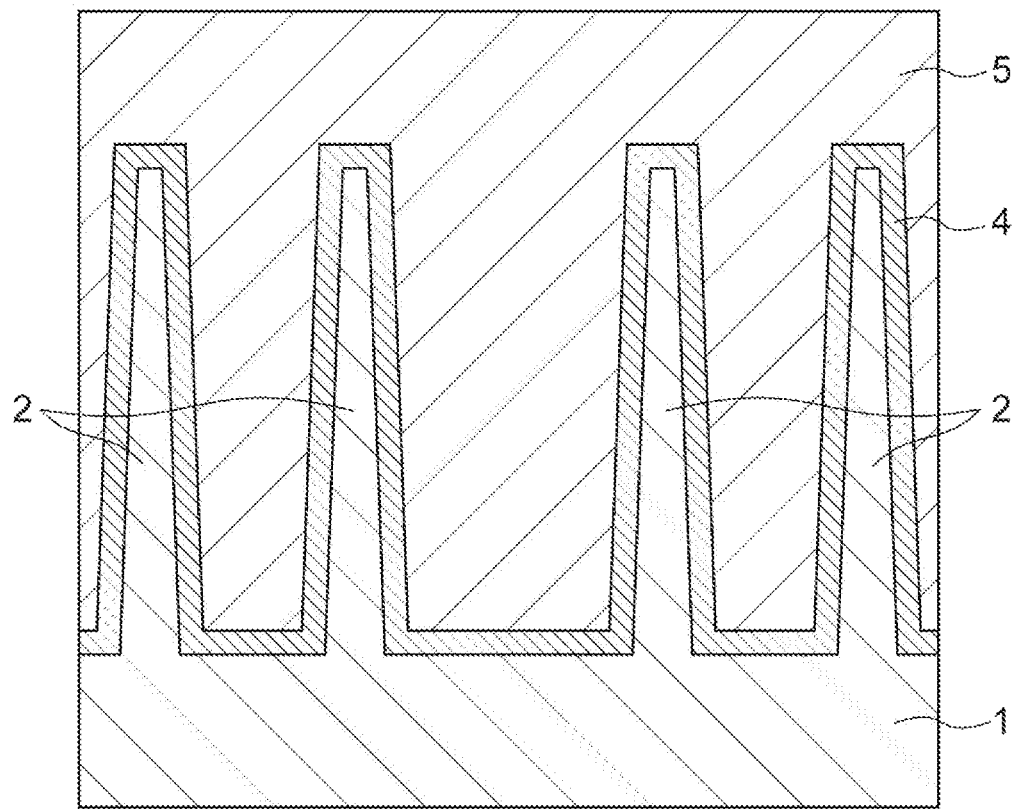
FIG. 9 is a vertical sectional view of the intermediate body of the logic standard cell.

FIG. 9 is a vertical sectional view of the intermediate body of the logic standard cell.

Next, the semiconductor fin 2 is heated in an oxygen atmosphere to form an oxide film ($SiO_2$) on the entire surface of the substrate. The temperature during the formation of the thermal oxide film is set to be in a range of 400° C. to 1000° C., and the thickness of an oxide film 4 covering the semiconductor fin 2 is set to be in a range of 3 to 6 nm. Further, a protective film 5 (protective material) is formed on the surface of the entire substrate. The material of the protective film 5 is amorphous carbon, and the forming method is CVD/PVD or spin coating. The protective film 5 is filled between the semiconductor fins 2 adjacent to each other. However, the thickness of the protective film 5 is set such that it covers the top surface of the semiconductor fin 2 and the surface thereof is located at a position higher than the top surface.

Figure 10:
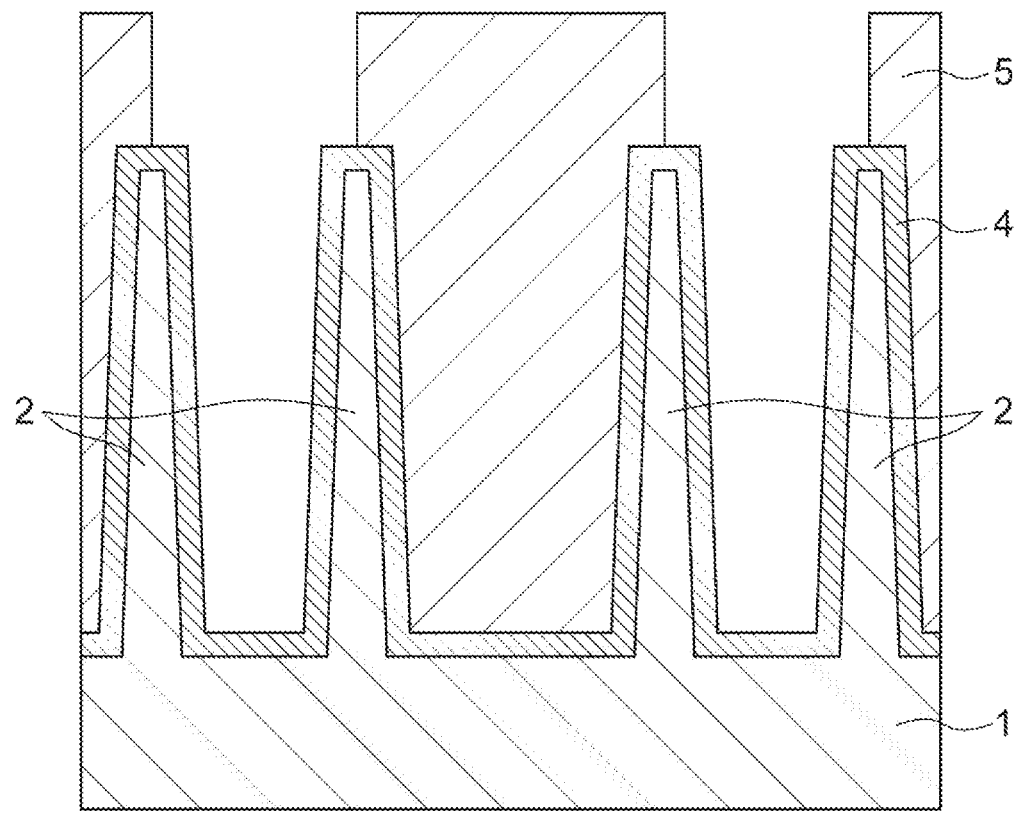
FIG. 10 is a vertical sectional view of the intermediate body of the logic standard cell.

FIG. 10 is a vertical sectional view of the intermediate body of the logic standard cell.

Next, the protective film 5 is partially removed, and a first region between the pair of semiconductor fins 2 on the left side and a second region between the pair of semiconductor fins 2 on the right side are opened. The removal of the protective film 5 is performed by etching through a mask. That is, a photoresist is applied on the protective film 5, a mask for opening the first and second regions and protecting the remaining region is formed by the patterning of the photoresist by photolithography, and the protective film 5 in the opening of the mask is etched. The method of etching the protective film (amorphous carbon) is dry etching, and as an etching apparatus, a capacitively-coupled plasma (CCP) type etching apparatus can be adopted.

The specific conditions of the etching at this time are as follows.

Etching gas: CO
Etching temperature: 100 to 350° C.
Etching time: 20 to 60 sec

As the etching gas, instead of CO, $N_2$ or $H_2$ can be used, and a mixed gas containing two or more gases selected from the etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

In this way, a part of the protective film 5 is etched, and the oxide film 4 located at the bottom portion between the semiconductor fins 2 is exposed. The oxide film or the nitride film in the description is an insulating film.

Figure 11:
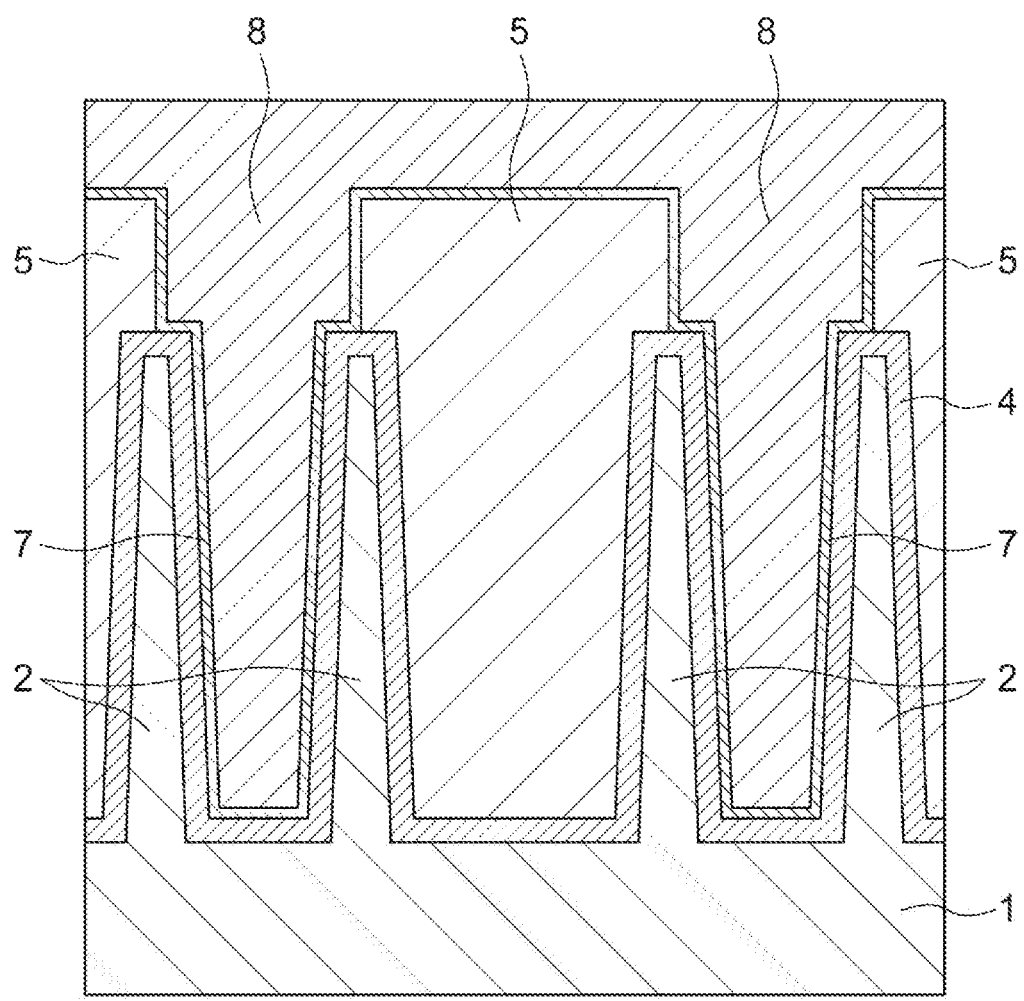
FIG. 11 is a vertical sectional view of the intermediate body of the logic standard cell.

FIG. 11 is a vertical sectional view of the intermediate body of the logic standard cell.

Next, a liner film 7 is formed on the surface of the substrate. The liner film 7 covers the oxide film 4 located on the side surface of the semiconductor fin 2, and the protective film 5.

The method of forming the liner film 7 is a well-known atomic layer deposition (ALD) method, and the specific forming conditions are as follows.

Material of liner film 7: TiN
Forming temperature: 200 to 600° C.
Thickness: 0.5 nm to 2.0 nm
Source gas: $TiCl_4$+$N_2$/$N_2$ (alternately supplied onto the substrate surface)

As the material of the liner film 7, instead of TiN, TaN may be used, and instead of the ALD method, a chemical vapor deposition (CVD) method can also be used.

Thereafter, the conductive material 8 for configuring the fixed potential line described above is formed on the substrate. As the conductive material, ruthenium (Ru) can be used. Ru is a platinum group element and has the property of dissolving in acid. As the conductive material 8, it is possible to use tungsten (W) or the like in addition to Ru. However, in a case of using Ru, it has the advantage of lower resistance than the metal. The conductive material 8 is located not only in the region between the semiconductor fins 2 but also above the surface of the uppermost portion of the protective film 5.

The method of forming the conductive material 8 (Ru) is a CVD method, and the specific forming conditions are as follows.

Material of conductive material 8: Ru
Forming temperature: 200 to 500° C.
Maximum thickness in Z-axis direction: 30 to 60 nm
Source gas: ruthenium carbonyl ($Ru(CO)_{12}$)
Carrier gas: Ar The conductive material 8 (Ru) can also be formed by using a physical vapor deposition (PVD) method such as a sputtering method. Further, it is possible to use tungsten (W) for the conductive material 8. However, in this case, the conductive material 8 (W) can be formed by using a CVD method or a sputtering method.

Figure 12:
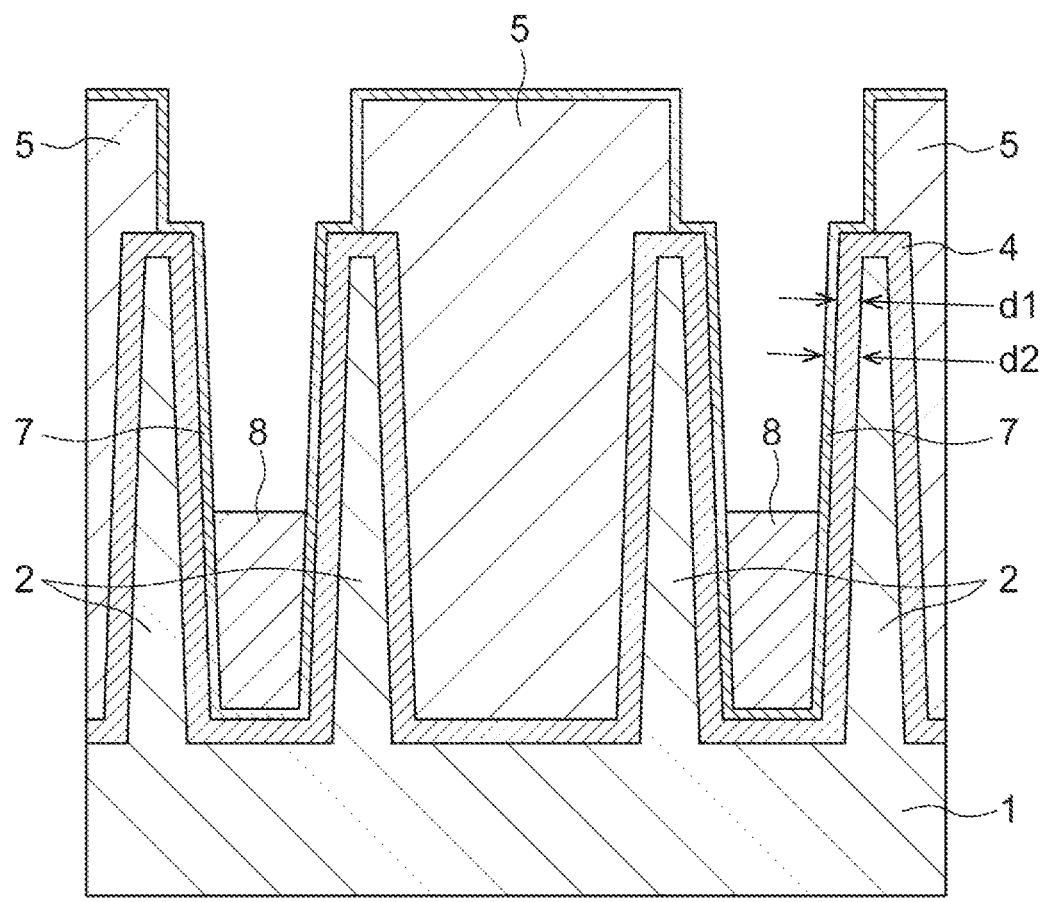
FIG. 12 is a vertical sectional view of the intermediate body of the logic standard cell.

FIG. 12 is a vertical sectional view of the intermediate body of the logic standard cell.

Next, the conductive material 8 is etched back again to remove a part thereof. By this etch back, the thickness (height) of the conductive material 8 is reduced to 50 nm, and the surface thereof is located below the top surface of the semiconductor fin 2. The liner film 7 (TiN) is an etching barrier film with respect to the etching gas or the etching liquid for the conductive material 8.

The method of etching back the conductive material 8 is dry etching, and as an etching apparatus, a capacitively-coupled plasma (CCP) type etching apparatus can be adopted.

The specific conditions for the etch back at this time are as follows.

Etching gas: $CF_4$
Etching temperature: 20 to 100° C.
Etching time: 30 sec to 240 sec As the etch-back gas, instead of $CF_4$, a mixed gas of $O_2$ and $Cl_2$ can be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

Further, as the method of etching the conductive material 8 (Ru), a wet etching method can also be used.

The etching of the liner film 7 (TiN) is performed by wet etching. As an etching liquid for Ru, $H_2O_2$, FPM (hydrofluoric acid-hydrogen peroxide mixture liquid), and the like are known, and for example, the etching temperature can be set to be in a range of 20 to 100° C. and the etching time can be set to be in a range of 30 to 240 sec. As an etching liquid for TiN, a mixed solution of $H_2O_2$ and ammonium hydroxide is also known. The liner film 7 is etched to the same height as the conductive material 8.

Figure 13:
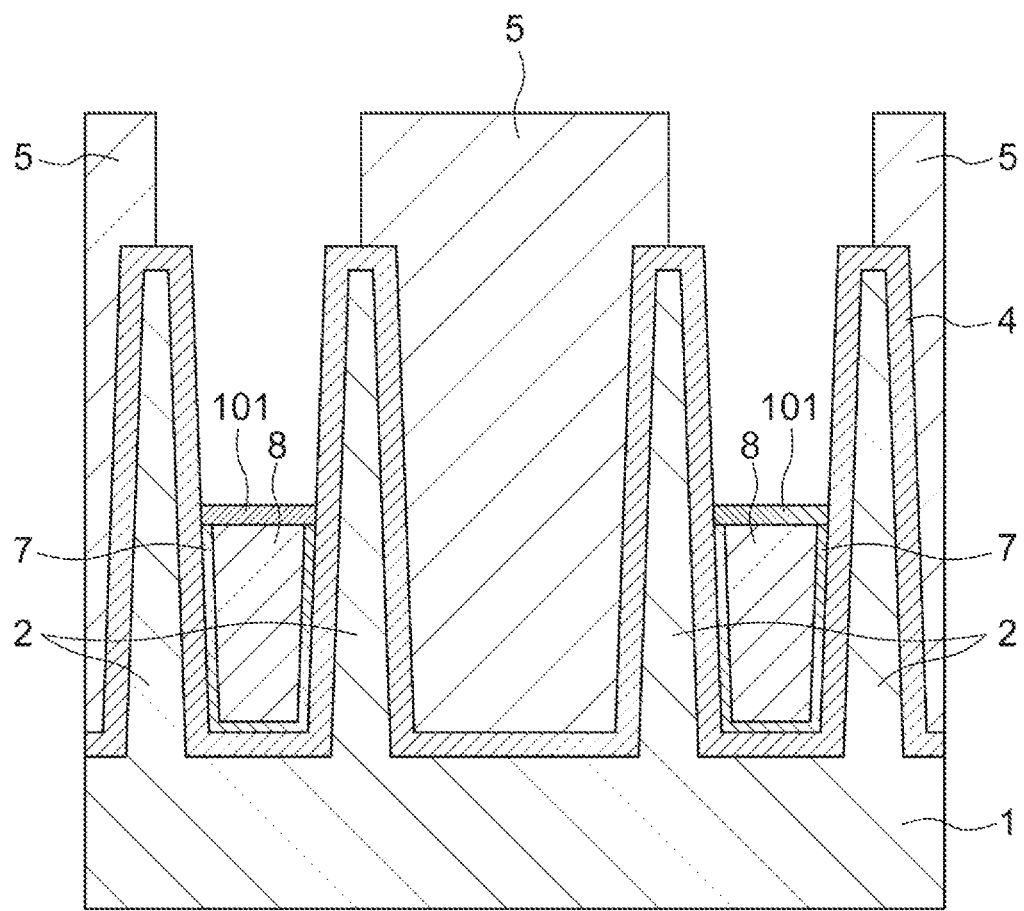
FIG. 13 is a vertical sectional view of the intermediate body of the logic standard cell.

FIG. 13 is a vertical sectional view of the intermediate body of the logic standard cell.

After the liner film 7 is removed by etching to the same height as the conductive material 8, a cap film 101 is formed on the exposed surface of the conductive material 8. The material of the cap film 101 is an antioxidant film for the conductive material 8 and is also a barrier film for protecting the conductive material 8 from etching. Since the cap film 101 is not etched when the material to be etched formed on the cap film 101 is etched, the cap film 101 also functions as an etching stop film. The material of the cap film 101 is $Si_3N_4$. However, instead of this, TiN, TaN, AlOx ($Al_2O_3$ or the like) or the like can be used.

FIG. 14 is a vertical sectional view of the intermediate body of a logic standard cell.

Next, the protective film 5 is removed. Since the protective film 5 is formed of amorphous carbon, ashing is used to remove the amorphous carbon. The ashing is a method of removing carbonaceous compounds such as photoresist, and for example, oxygen ($O_2$) plasma is generated by a plasma generation apparatus, and the amorphous carbon is removed by irradiating the amorphous carbon with the oxygen plasma. In addition, photo-excited ashing in which irradiation of ultraviolet rays is performed in an atmosphere of ozone ($O_3$) gas is also known.

Figure 15:
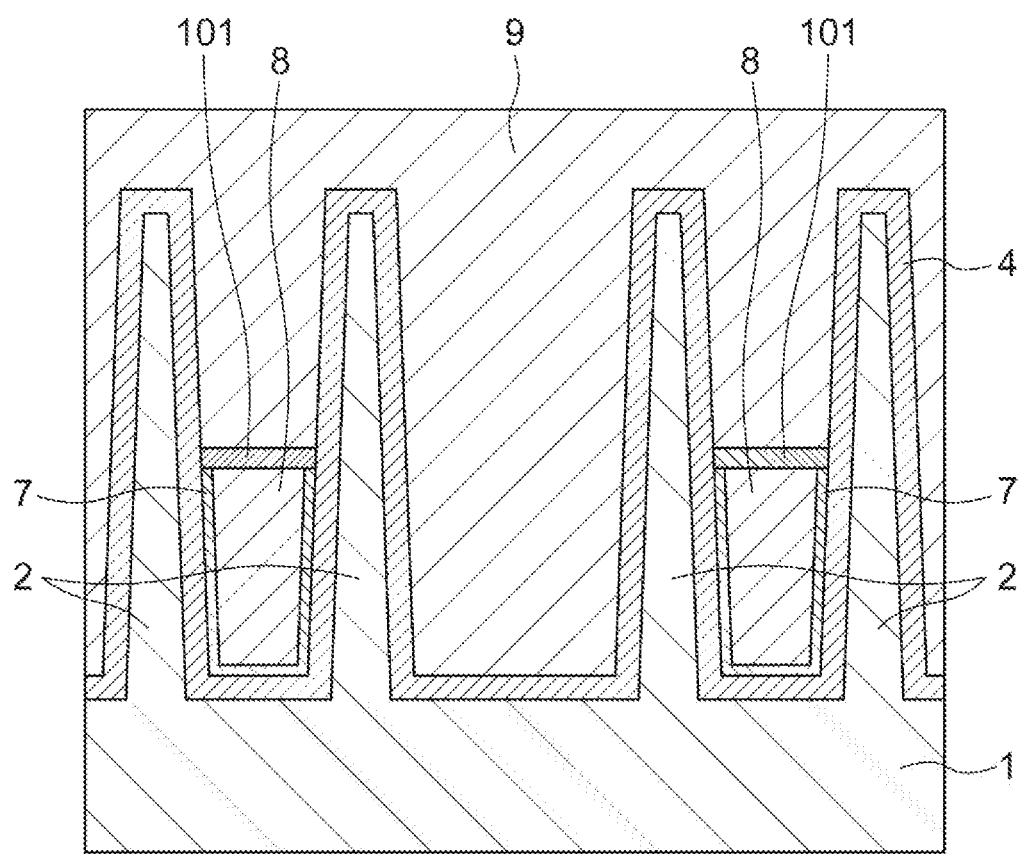
FIG. 15 is a vertical sectional view of the intermediate body of the logic standard cell.

FIG. 15 is a vertical sectional view of the intermediate body of the logic standard cell.

Thereafter, an oxide film 9 ($SiO_2$) is formed on the entire surface of the substrate. The thickness of the oxide film 9 is higher than the height of the semiconductor fin 2. As the method of forming the oxide film 9, an ALD method, a CVD method, a coating method, or the like can be applied. As a manner of transferring the substrate to the processing apparatus and processing the substrate therein, a batch processing apparatus or a single-wafer film forming apparatus can be adopted, and in a case of using a coating method, spin coating can be adopted as the film forming apparatus.

The specific conditions for forming the silicon oxide film 9 include the CVD method and are as follows.

Deposition material: TEOS (tetraethyl orthosilicate), $O_2$
Deposition time: 10 sec to 1800 sec
Forming temperature: 400 to 900° C.
Oxidation time: 1 hour In a case of adopting the ALD method using tetraethoxysilane, the forming temperature is in a range of 150 to 400° C.

Figure 16:
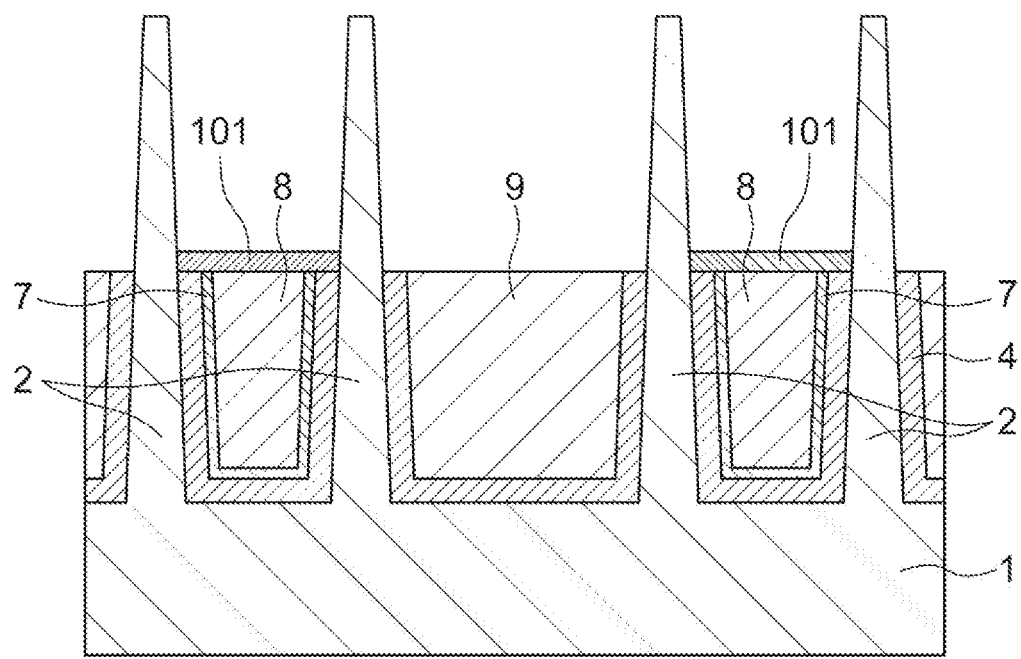
FIG. 16 is a vertical sectional view of the intermediate body of the logic standard cell.

FIG. 16 is a vertical sectional view of the intermediate body of the logic standard cell.

Next, the entire surface of the substrate on which the oxide film 9 is formed is etched again to remove the oxide film 4 provided at the upper portion of the semiconductor fin 2, together with the oxide film 9. In this way, the semiconductor portion of the semiconductor fin 2 is exposed, and the oxide film 4 and the oxide film 9 partially remains. The method of etching the oxide film 4 and the oxide film 9 is dry etching, and as an etching apparatus, a capacitively-coupled plasma (CCP) type etching apparatus can be adopted.

The specific conditions of the etching at this time are as follows.

Etching gas: $C_4F_8$
Etching temperature: 20 to 100° C.
Etching time: 5 to 60 sec As the etching gas, instead of $C_4F_8$, $CF_2$, $CF_3$, $C_2F_2$, $C_2F_4$, $C_2F_6$, Ar, $CHF_3$, $O_2$, or $O_3$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

Figure 17:
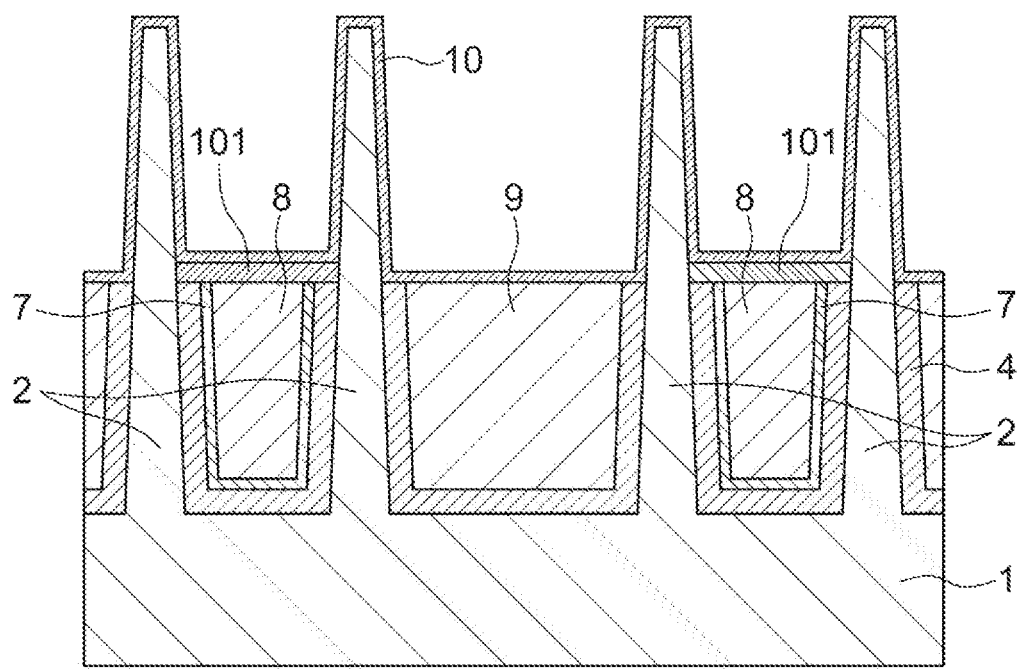
FIG. 17 is a vertical sectional view of the intermediate body of the logic standard cell.

FIG. 17 is a vertical sectional view of the intermediate body of a logic standard cell.

Next, a gate oxide film 10 is formed to cover the exposed surface of the semiconductor fin 2. The gate oxide film 10 is composed of two layers of oxide films. First, the exposed portion of the semiconductor fin 2 is heated in an oxygen atmosphere to form a thermal oxide film having a thickness of 1.4 nm on the surface. Thereafter, a CVD oxide film having a thickness of 2 nm is formed to cover the thermal oxide film. Therefore, the oxide film 10 having a total thickness of 3.4 nm is formed. The thickness of the semiconductor fin 2 after oxidation in the X-axis direction is 6.5 nm at the position of the top surface and is 8.5 nm at the position of the upper end portion of the oxide film 4.

Figure 18:
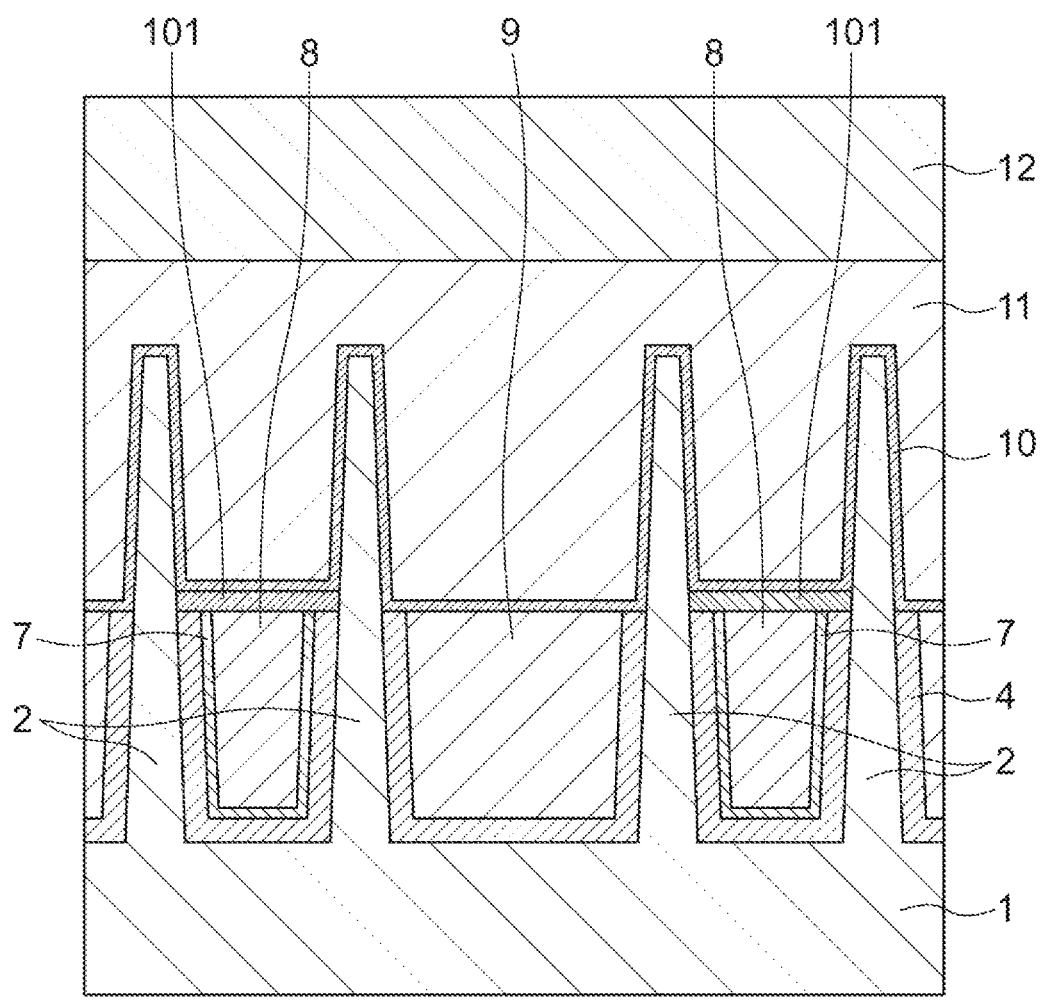
FIG. 18 is a vertical sectional view of the intermediate body of the logic standard cell.
Figure 19:
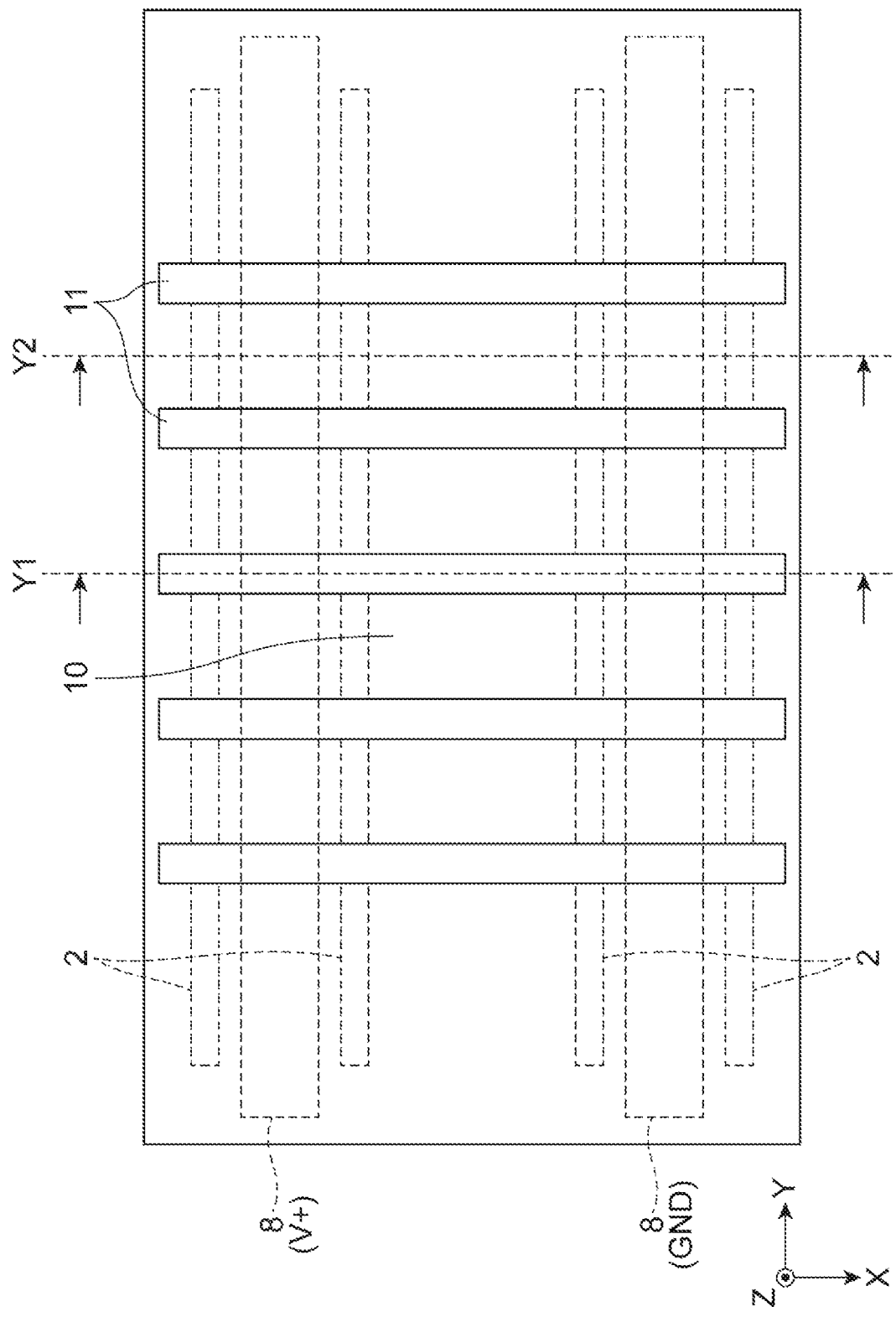
FIG. 19 is a plan view of the intermediate body of the logic standard cell.

FIG. 18 is a vertical sectional view of the intermediate body (in the vicinity of the gate) of the logic standard cell, and FIG. 19 is a plan view of the intermediate body of the logic standard cell. FIG. 18 is a vertical cross-section taken along the dotted line Y1 in FIG. 19.

Next, a dummy gate electrode 11 is formed on the semiconductor fin 2 with the oxide film 10 interposed therebetween. The dummy gate electrode 11 is provided only in a region functioning as a gate region of a transistor or a switch. The method of forming the dummy gate electrode 11 is as follows.

First, a conductive material (polysilicon) for a dummy gate is formed on the substrate by a CVD method using a $SiH_4$ based source gas. Next, an inorganic insulator mask 12 in which the stripe-shaped region is protected along the X-axis direction and the rest is open is formed on the conductive material layer.

The inorganic insulator mask 12 is made of an inorganic insulator such as a silicon nitride film. To form this inorganic insulator mask, first, an inorganic insulating layer ($Si_3N_4$) is deposited on the conductive material (polysilicon) by a CVD method, and then a photoresist is applied on the inorganic insulating layer to form an organic resin mask having the same pattern as the inorganic insulator mask 12. The organic resin mask is formed by patterning the photoresist by photolithography. By etching the inorganic insulating layer ($Si_3N_4$) in the opening by using the organic resin mask, the inorganic insulator mask 12 is formed. As the method of depositing the inorganic insulating layer, a sputtering method can also be adopted.

The method of etching the inorganic insulating layer ($Si_3N_4$) is dry etching, and as an etching apparatus, a capacitively-coupled plasma (CCP) type etching apparatus can be adopted.

The specific conditions of the etching at this time are as follows.

Etching gas: $CF_4$ and $O_2$
Etching temperature: 20 to 100° C.
Etching time: 5 to 120 sec As the etching gas, instead of $CF_4$ and $O_2$, $SF_6$, $SF_5$, $SF_4$, $SF_3$, $SF_2$, Ar, or $N_2$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

After the inorganic insulator mask 12 is formed, the conductive material (polysilicon) located in the opening of the inorganic insulator mask 12 is etched, so that the conductive material remains only on the gate region and the dummy gate electrode 11 is formed.

The method of etching the conductive material (polysilicon) is dry etching, and as an etching apparatus, a capacitively-coupled plasma (CCP) type etching apparatus can be adopted.

The specific conditions of the etching at this time are as follows.

Etching gas: $Cl_2$ and HBr
Etching temperature: 20 to 120° C.
Etching time: 5 to 300 sec As the etching gas, instead of $Cl_2$ and HBr, $Cl_2$ or $SF_6$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

In this way, the five dummy gate electrodes 11 extending along the X-axis direction are formed on the substrate (refer to FIG. 19). In FIG. 19, the illustration of the inorganic insulator mask 12 on the dummy gate electrodes 11 is omitted.

Figure 20:
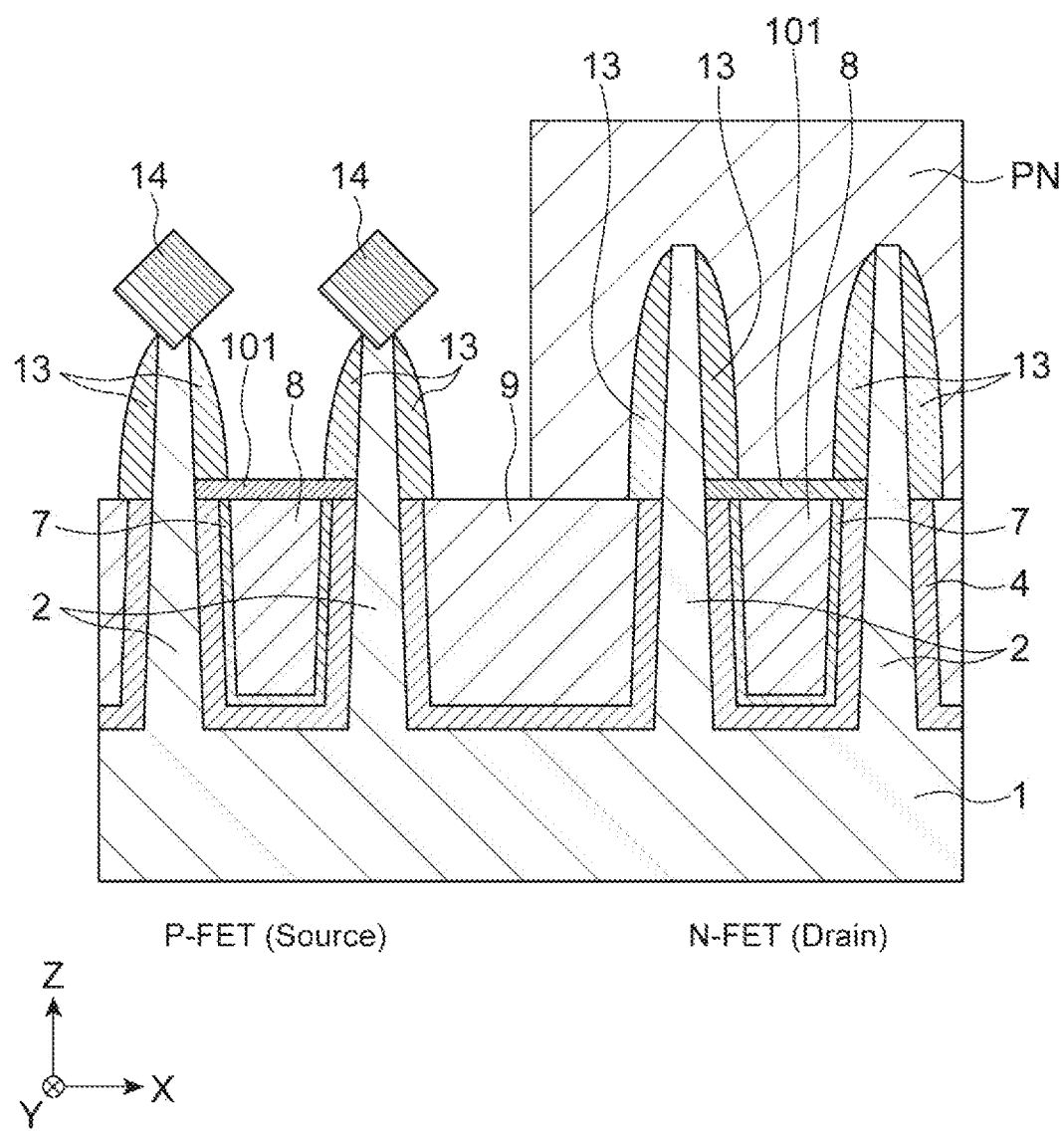
FIG. 20 is a vertical sectional view of the intermediate body of the logic standard cell.

FIG. 20 is a vertical sectional view (Y2 cross-section) of the intermediate body (in the vicinity of the source/drain) of the logic standard cell. In FIG. 19, the source/drain of the transistor is located at the position of the dotted line Y2.

In FIG. 18, the oxide film 10 is formed at the upper portion of the semiconductor fin 2. However, in the formation of the source region and the drain region, the oxide film 10 shown in FIG. 18 is removed. The oxide film 10 can be removed in the polysilicon etching step when forming the dummy gate electrode 11 shown in FIG. 18.

Next, a sidewall 13 made of SiCN is formed on the surface of the semiconductor fin 2 to cover the semiconductor fin 2. The method of forming the sidewall 13 is a PE-CVD (Plasma Enhanced-Chemical Vapor Deposition) method, and is specifically as follows.

Reaction gas: ($SiH_4$, $CH_4$, $H_2$, $N_2$), or ($N_2$, $(CH_3)_3Si$—NH—$Si(CH_3)_3$ (hexamethyldisilazane (HMDS)))
Forming temperature: 200 to 600° C.
Forming time: 10 to 300 sec The initial sidewall 13 covers the entire upper portion of the semiconductor fin 2, and also covers the side surface and top surface of the semiconductor fin 2 and the bottom portion between the fins. However, by sputter-etching the surface of the substrate with a rare gas such as argon, the sidewalls on the upper portion of the semiconductor fin 2 and the film on the bottom portion between the fins are removed, the upper portion is open, and the sidewall 13 is formed.

Next, a protective film PN is formed on the region where the N-FET is to be formed (the region where the semiconductor fins 2 on the right side of the drawing is formed). The material and forming method of the protective film PN are as follows.

Material: resist
Forming method: spin coating

Thereafter, the sidewall 13 in the region where the P-FET is to be formed (the region where the semiconductor fins 2 on the left side of the drawing is formed) is etched. Due to this etching, the sidewall 13 on the left side of the drawing has a desired height. The sidewall 13 may be formed by crystal growth of the constituent material thereof.

The method of etching the sidewall 13 (SiCN) is dry etching, and as an etching apparatus, a capacitively-coupled plasma (CCP) type etching apparatus can be adopted.

The specific conditions of the etching at this time are as follows.

Etching gas: $CF_4$ and $H_2O$
Etching temperature: 20 to 100° C.
Etching time: 5 to 300 sec As the etching gas, instead of $CF_4$ and $H_2O$, $COF_2$, $OF_2$, or $O_2F_2$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

Thereafter, the semiconductor fin 2 in the region where the P-FET is to be formed is etched to a position near the upper end of the sidewall 13.

The method of etching the semiconductor fin 2 (Si) is dry etching, and the specific conditions of the etching at this time are as follows.

Etching gas: $CF_4$
Etching temperature: 20 to 100° C.
Etching time: 10 to 60 sec As the etching gas, instead of $CF_4$, $O_2$, $N_2$, or $H_2$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted. Further, other etching gases can also be applied.

Next, a conductive region 14 made of SiGe containing boron at a high concentration is epitaxially grown on the exposed surface of the semiconductor fin 2 for the P-FET whose upper portion is etched.

The conductive region 14 (SiGe) functions as a source region or a drain region having electrical conductivity in the P-FET, and as the crystal growth method, a CVD (chemical vapor deposition) method is adopted. The specific conditions for the crystal growth at this time are as follows.

Source gas: $SiH_4$, $GeH_4$
Impurity gas: B (boron)-containing gas
Growth temperature: 550 to 700° C.
Growth time: 15 to 60 min Boron (B) is a P-type (first conductivity type) impurity in Si, and phosphorus (P) or arsenic (As) is an N-type (second conductivity type) impurity in Si. Further, as the source gas, instead of $SiH_4$, $Si_2H_6$ can also be used.

Next, the conductive region 15 on the N-FET side is formed.

Figure 21:
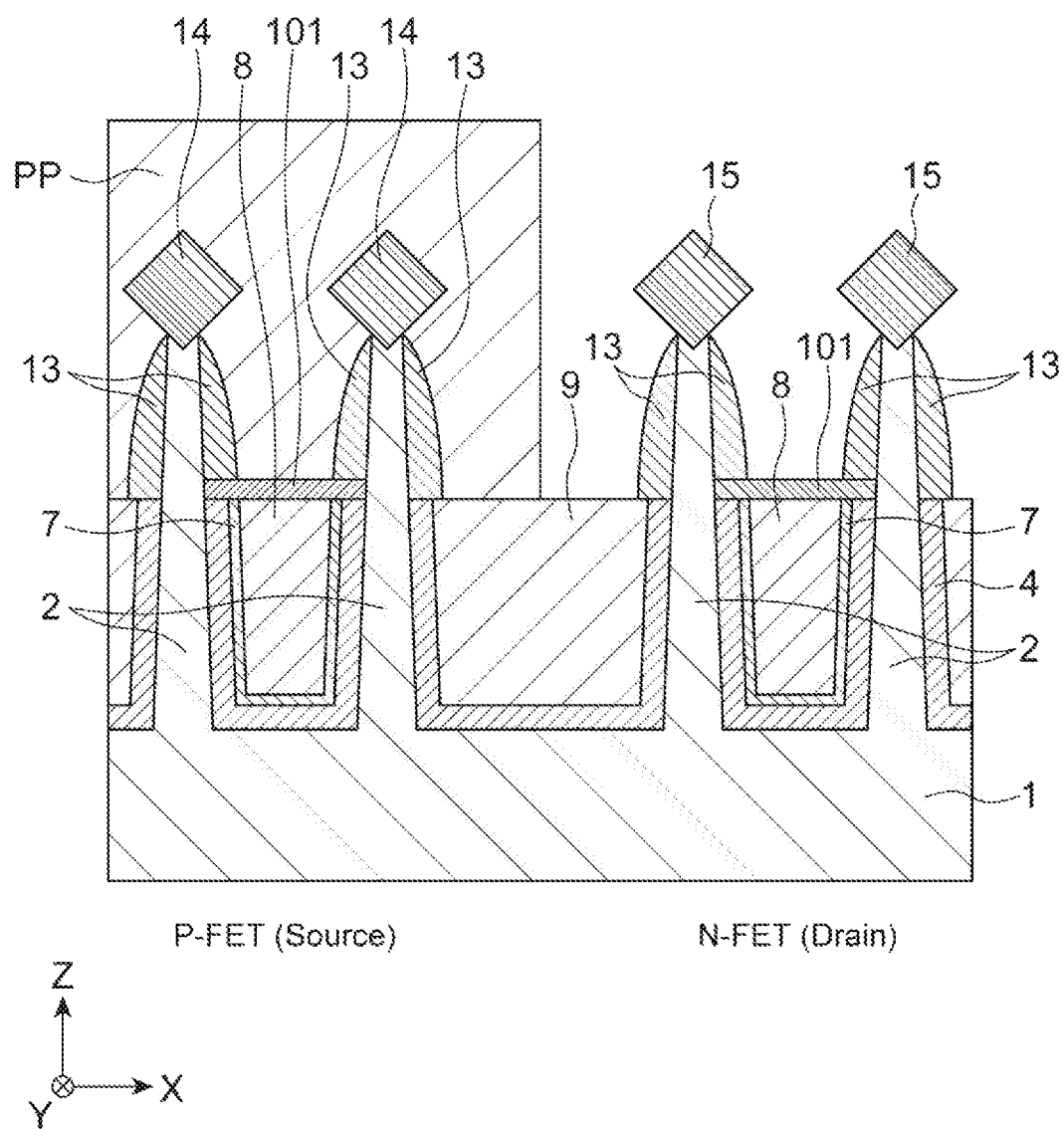
FIG. 21 is a vertical sectional view of the intermediate body of the logic standard cell.

FIG. 21 is a vertical sectional view (Y2 cross-section) of the intermediate body (in the vicinity of the source/drain) of the logic standard cell.

First, the protective film PN on the region where the N-FET is to be formed (the region where the semiconductor fins 2 on the right side of the drawing is formed) is removed by ashing, and a protective film PP is formed on the region where the P-FET is to be formed (the region where the semiconductor fins 2 on the left side of the drawing is formed). The material and forming method for the protective film PP are the same as the material and forming method for the protective film PN.

Thereafter, the sidewall 13 in the region where the N-FET is to be formed (the region where the semiconductor fins 2 on the right side of the drawing is formed) is etched. Due to this etching, the sidewall 13 on the right side of the drawing has a desired height. The sidewall 13 may be formed by crystal growth of the constituent material thereof.

The etching method for the sidewall 13 (SiCN) on the right side is the same as the etching method for the sidewall 13 on the left side described above.

Thereafter, the semiconductor fin 2 in the region where the N-FET is to be formed is etched to a position near the upper end of the sidewall 13. The method of etching the right-side semiconductor fin 2 (Si) at this time is the same as the method of etching the left-side semiconductor fin 2 described above.

Next, a conductive region 15 made of Si containing nitrogen, phosphorus, arsenic, or the like at a high concentration is epitaxially grown on the exposed surface of the semiconductor fin 2 for the N-FET whose upper portion is etched. Si grows epitaxially with the crystal axes aligned.

The conductive region 15 functions as a source region or a drain region having electrical conductivity in the N-FET, and as a crystal growth method, a CVD (chemical vapor deposition) method is adopted. The specific conditions for the crystal growth at this time are as follows.

Source gas: $SiH_4$, $C_2H_4$
Impurity gas: $N_2$
Growth temperature: 1300 to 1800° C.
Growth time: 60 to 120 min As the impurity gas, in addition to $N_2$, a gas containing P, As, Sb, or the like, which is an N-type impurity, can be used. In a case of forming a P-type semiconductor, P-type impurities such as B or Al are used.

Figure 22:
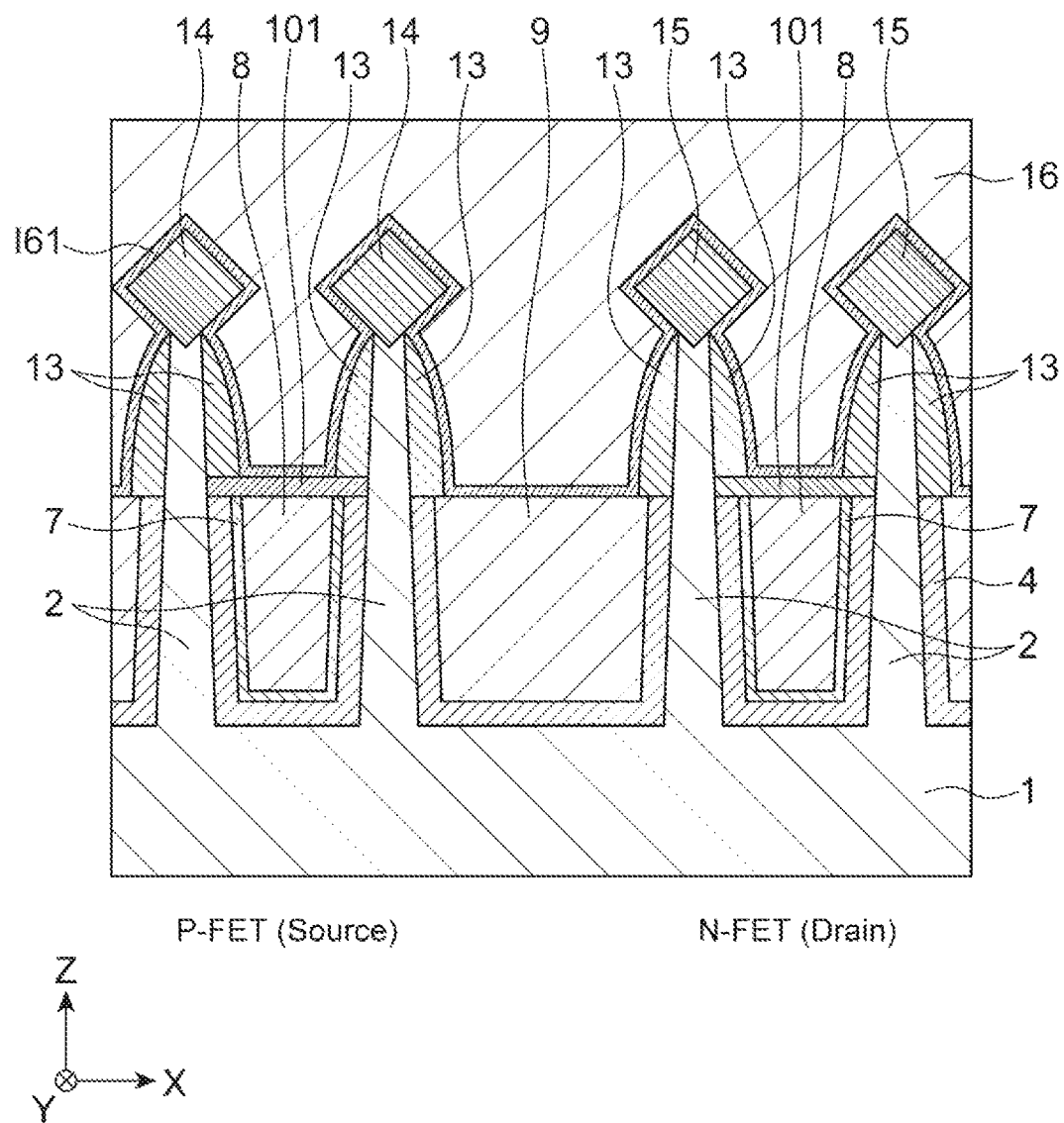
FIG. 22 is a vertical sectional view of the intermediate body of the logic standard cell.

Next, the protective film PP is removed by ashing. Further, as shown in FIG. 22, a nitride film ($Si_3N_4$) 161 and an oxide film 16 ($SiO_2$) are sequentially formed to cover the entire surface of the substrate. As the method of forming the nitride film 161, for example, the same CVD method as that for the insulator 17 can be used.

FIG. 22 is a vertical sectional view (Y2 cross-section) of the intermediate body (in the vicinity of the source/drain) of the logic standard cell. The surface position of the oxide film 16 is higher than the heights of the conductive region 14 and the conductive region 15. The method of forming the oxide film 16 is film formation or coating, and as a forming apparatus, CVD/PVD or spin coating can be adopted.

A specific method of forming the oxide film 16 ($SiO_2$) is a CVD method and is as follows.

Raw material: TEOS (tetraethyl orthosilicate), $O_2$
Forming temperature: 400 to 900° C.
Forming time: 5 to 12 hours The oxide film 16 can also be formed by using a PVD method or spin coating. The forming temperature in the CVD method can be set to be in a range of 300 to 1200° C., and instead of $O_2$, $O_3$ can also be used. Perhydropolysilazane can be used in a coating method by spin coating.

After the oxide film 16 is formed, the surface of the oxide film 16 is flattened by chemical mechanical polishing (CMP).

Figure 23:
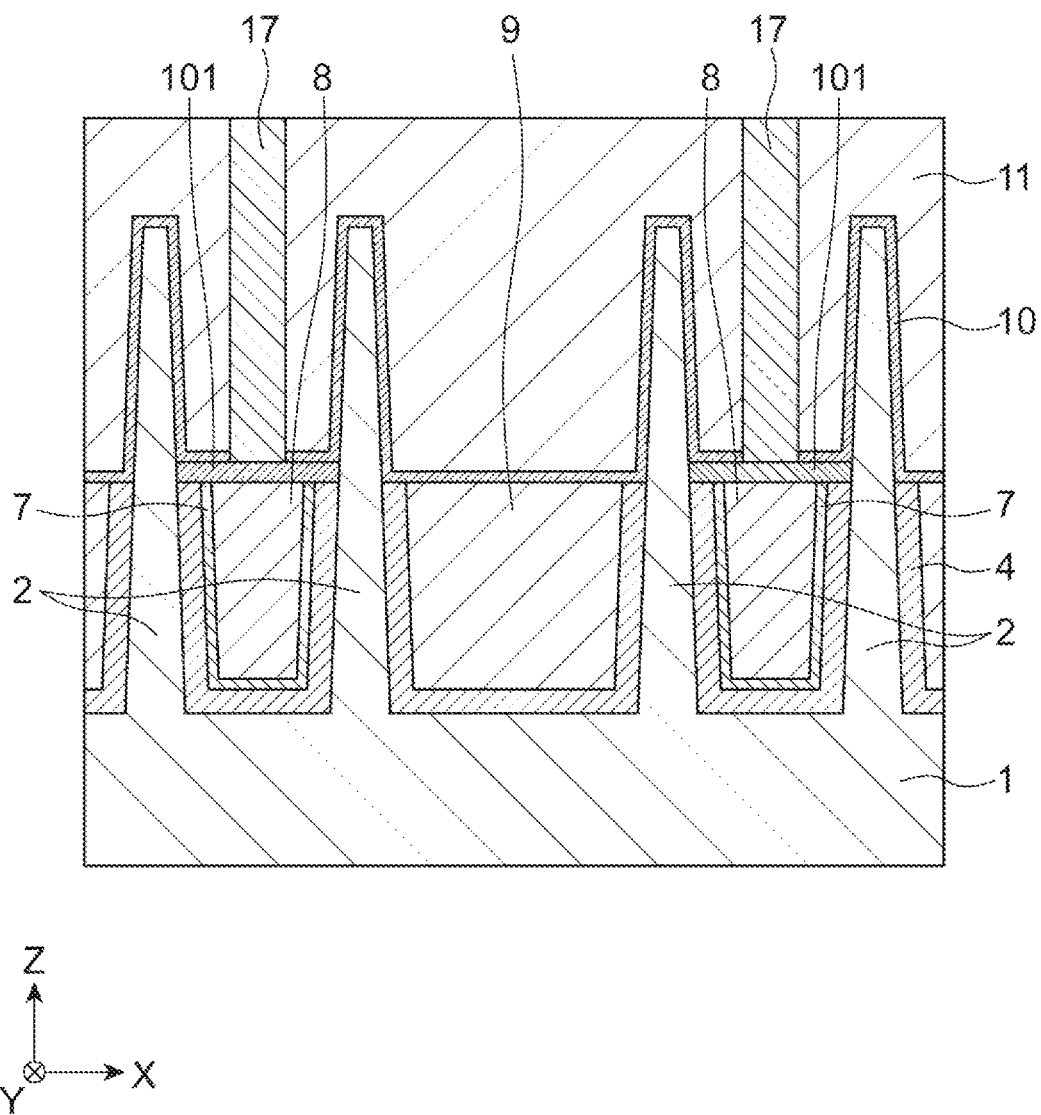
FIG. 23 is a vertical sectional view of the intermediate body of the logic standard cell.
Figure 24:
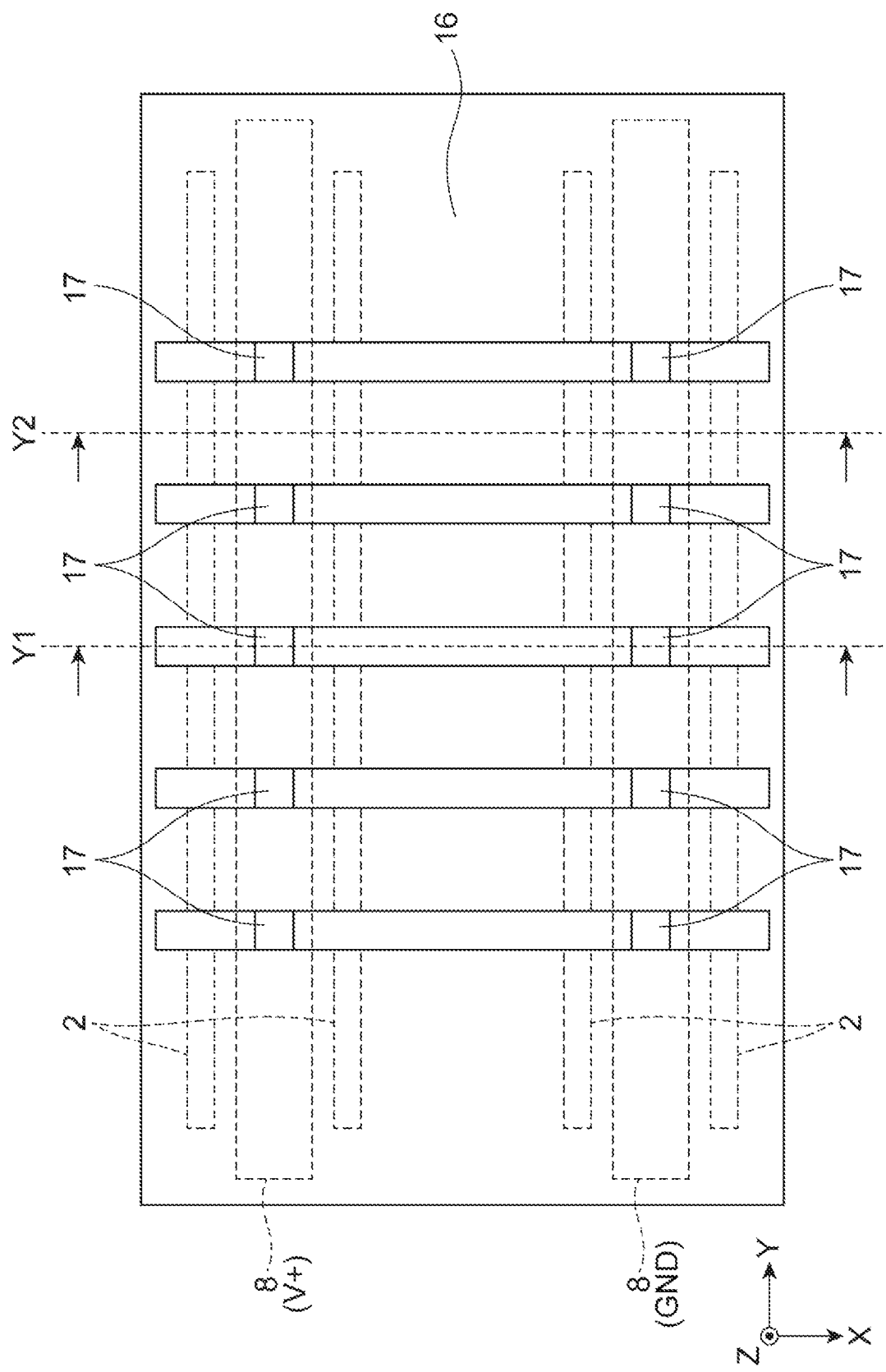
FIG. 24 is a plan view of the intermediate body of the logic standard cell.

FIG. 23 is a vertical sectional view (Y cross-section) of the intermediate body (in the vicinity of the gate) of the logic standard cell, and FIG. 24 is a plan view of the intermediate body of the logic standard cell. In FIG. 23, the gate of the transistor is located at the position of the dotted line Y1.

By the CMP described above, the inorganic insulator mask 12 (protective film) in FIG. 18 is also removed, the surface of the dummy gate electrode 11 is also flattened, and the surface is exposed. Here, a contact hole is formed in the region of the dummy gate electrode 11 immediately above the conductive material 8, and an insulating film 17 ($Si_3N_4$) is formed in this contact hole. The contact hole is formed by forming a mask having an opening at this portion and etching the dummy gate electrode 11.

The method of etching the dummy gate electrode 11 (polysilicon) is dry etching, and the specific conditions of the etching at this time are as follows.

Etching gas: $CF_4$
Etching temperature: 20 to 120° C.
Etching time: 5 to 300 sec As the etching gas, instead of $CF_4$, $O_2$, $N_2$, or $H_2$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

The insulating film 17 ($SiN_4$) is formed by vapor phase growth, and as a forming apparatus, a CVD apparatus or a PVD apparatus can be adopted. In the case of the CVD method, the specific conditions for forming the insulating film 17 are as follows.

Raw materials: $SiH_2Cl_2$ and $NH_3$
Forming temperature: 300 to 1200° C.
Forming time: 10 sec to 1800 sec After the insulating film 17 is formed on the entire surface of the substrate, by performing CMP on the insulating film 17, the insulating film 17 (insulator) is embedded in the contact hole. As shown in FIG. 24, the insulating films 17 are embedded at 10 locations with respect to the five dummy gate electrodes 11. The insulator 17 is used to separate functions between various elements.

Figure 25:
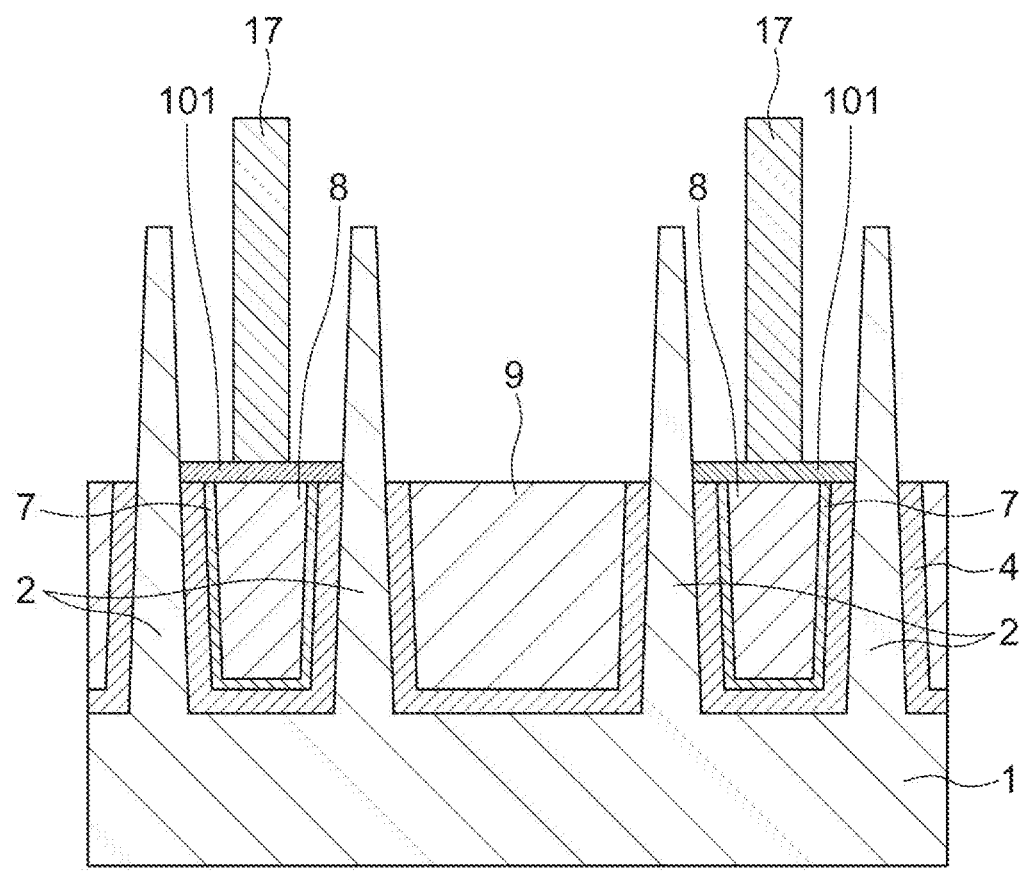
FIG. 25 is a vertical sectional view of the intermediate body of the logic standard cell.

FIG. 25 is a vertical sectional view (Y1 cross-section) of the intermediate body (in the vicinity of the gate) of the logic standard cell.

Subsequently, as shown in FIG. 25, the dummy gate electrode 11 shown in FIG. 23 is removed. The dummy gate electrode 11 is made of polysilicon, and the method of etching the dummy gate electrode 11 at this time is dry etching, and the specific conditions of the etching at this time are as follows.

Etching gas: $CF_4$
Etching temperature: 20 to 120° C.
Etching time: 5 to 300 sec As the etching gas, instead of $CF_4$, $O_2$ or $H_2$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

Thereafter, the thin oxide film 10 ($SiO_2$) shown in FIG. 23 is removed. The method of etching the oxide film 10 is dry etching, and the specific conditions of the etching at this time are as follows.

Etching gas: $C_4F_8$
Etching temperature: 20 to 100° C.
Etching time: 5 to 100 sec As the etching gas, instead of $C_4F_8$, $CF_2$, $CF_3$, $C_2F_2$, $C_2F_4$, $C_2F_6$, Ar, $CHF_3$, $O_2$, or $O_3$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

Subsequently, agate electrode is formed.

Figure 26:
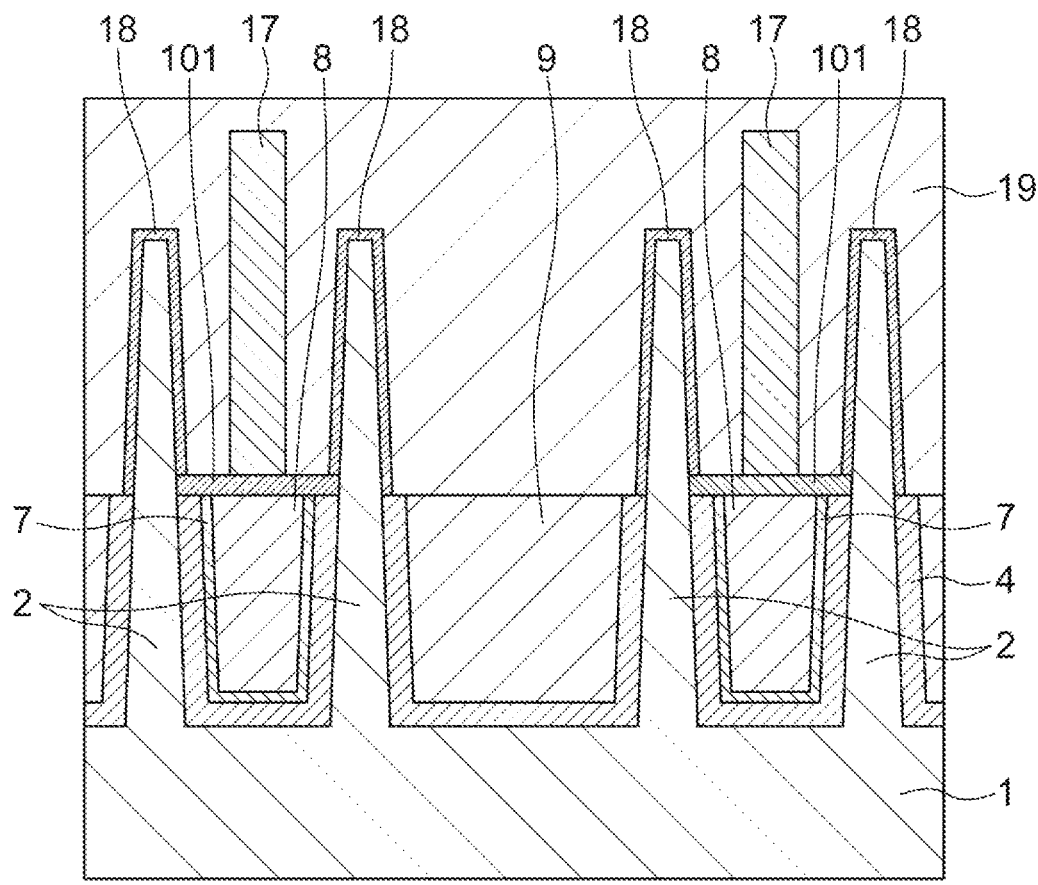
FIG. 26 is a vertical sectional view of the intermediate body of the logic standard cell.

FIG. 26 is a vertical sectional view (Y cross-section) of the intermediate body (in the vicinity of the gate) of the logic standard cell.

First, the exposed portion of the upper portion of the semiconductor fin 2 is oxidized to form a gate insulating film 18 on the semiconductor fin 2. The gate insulating film 18 is a thermal oxide film of Si and is formed by heating in an oxygen atmosphere at a temperature in a range of 800° C. to 1100° C. The gate insulating film 18 can also be formed at a temperature in a range of about 400 to 900° C. (CVD) or a temperature in a range of 150 to 400° C. (ALD). Next, a conductive material 19 made of metal is deposited and formed on the entire surface of the substrate. The deposition method is a sputtering method in which a target metal is decomposed or reacted, and a target metal (specifically, W (tungsten)) is sputtered with argon turned into plasma by a radio frequency plasma sputtering apparatus, and this metal is deposited on the surface of the substrate at room temperature. The conductive material 19 becomes the gate electrodes of the FET and the switch in the P-FET formation region.

FIG. 27 is a vertical sectional view (Y cross-section) of the intermediate body (in the vicinity of the gate) of the logic standard cell.

Next, the conductive material 19 located on the region where the N-FET is to be formed (the region on the right side) is selectively removed by etching. In the selective removal, a photoresist is applied on the region where the N-FET is to be formed, the photoresist is exposed and developed to form a mask in which only the region where the N-FET is to be formed is open, and the conductive material 19 is etched through the mask, and at the point in time when the oxide film 9 is exposed, the etching is stopped.

The method of etching the conductive material 19 (W) is dry etching, and the specific conditions of the etching at this time are as follows.

Etching gas: $CF_4$, $O_2$
Etching temperature: 100 to 350° C.
Etching time: 20 to 60 sec As the etching gas, instead of $CF_4$ and $O_2$, a mixed gas of $O_2$ gas, $CF_4$ gas, and HBr can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted. Wet etching is also possible.

Further, another conductive material 20 is deposited and formed in the space in the region where the N-FET is to be formed (the region on the right side) where the conductive material 19 has been removed. The deposition method is a sputtering method in which a target metal is decomposed or reacted, and a target metal (W) is sputtered with argon turned into plasma by a radio frequency plasma sputtering apparatus, and this metal is deposited on the surface of the substrate at room temperature. The conductive material 20 becomes a gate electrode of the FET and the switch in the N-FET formation region. Thereafter, the surface of the conductive material 20 is flattened by CMP.

The gate electrode (conductive material 19) on the P side and the gate electrode (conductive material 20) on the N side are in physical contact with each other and electrically connected to each other to function as an integrated gate electrode 21. The conductive material 19 and the conductive material 20 may be changed to different metals in a case of controlling the work function.

Figure 28:
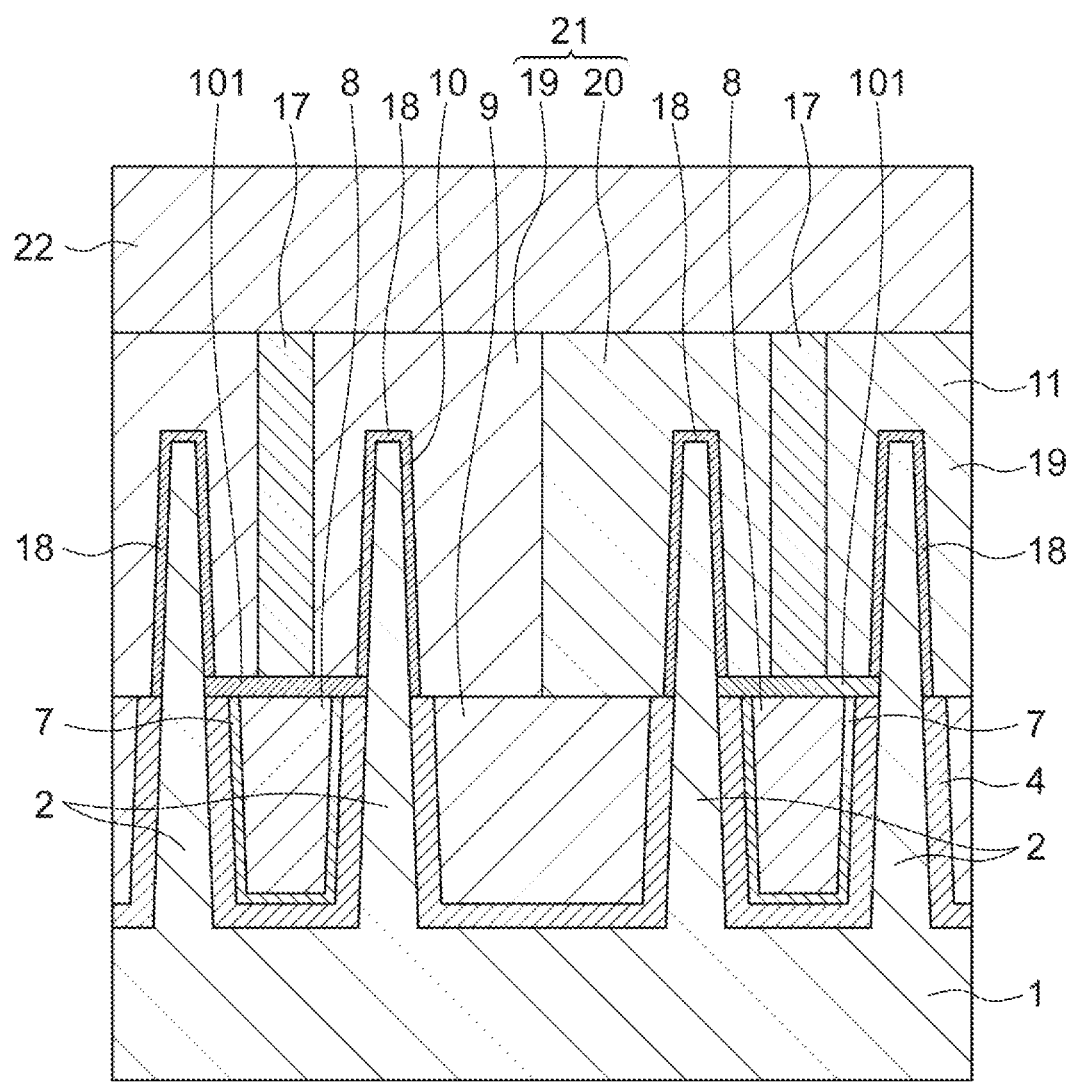
FIG. 28 is a vertical sectional view of the intermediate body of the logic standard cell.

FIG. 28 is a vertical sectional view (Y cross-section) of the intermediate body (in the vicinity of the gate) of the logic standard cell.

As shown in the drawing, after the integrated gate electrode 21 is formed, a protective nitride film 22 (SiNx) is formed on the gate electrode 21. As a forming method, the nitride film 22 is formed on the gate electrode 21 by a CVD method using $SiH_2Cl_2$ and $NH_3$ as source gases. The forming temperature is set to room temperature, and the thickness is set to 20 nm, for example.

Figure 29:
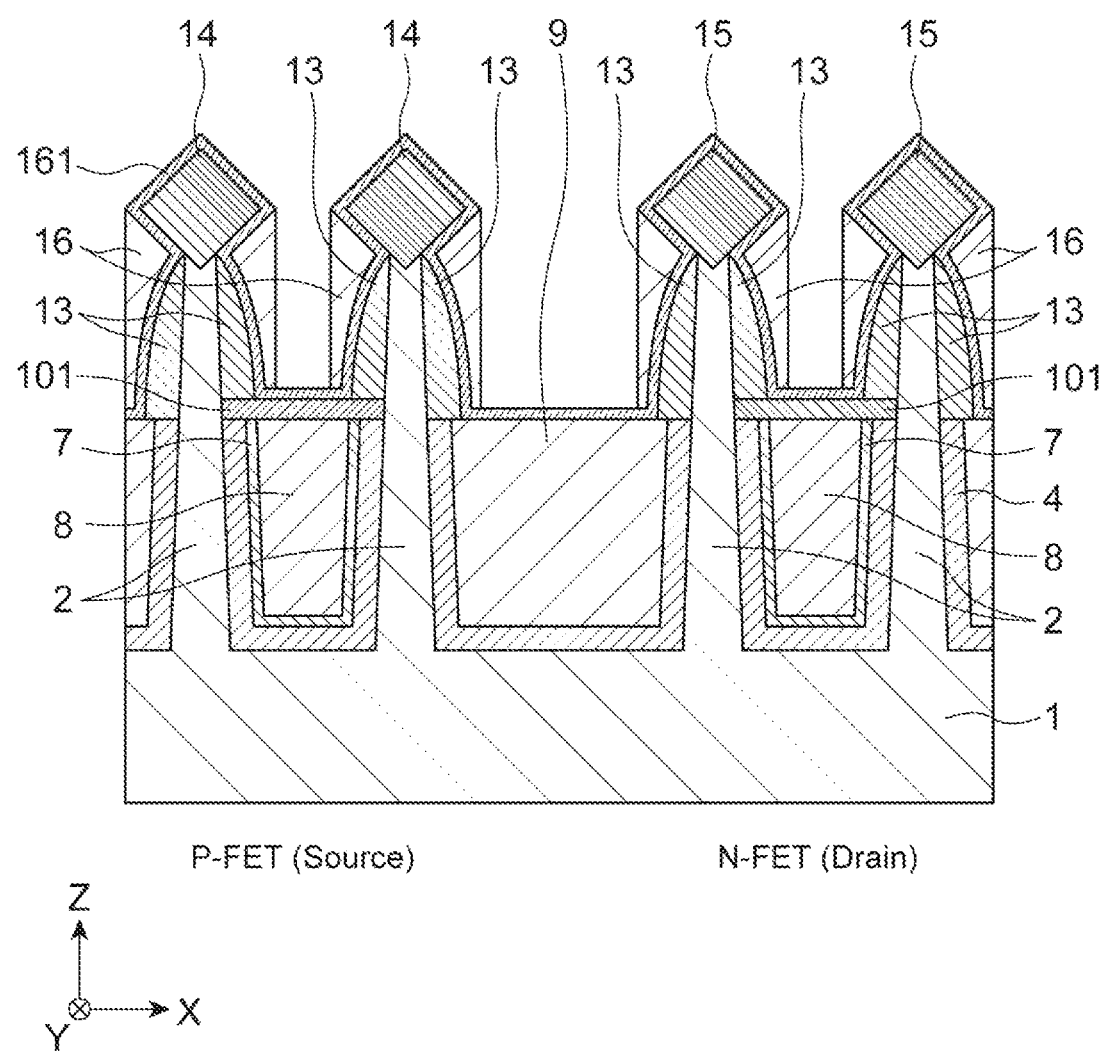
FIG. 29 is a vertical sectional view of the intermediate body of the logic standard cell.

Further, as shown in FIG. 29 (Y2 cross-section), the oxide films 16 on the source region (P-type conductive region 14) and the drain region (N-type conductive region 15) are removed by anisotropic etching, as shown in the drawing. A mask pattern is formed on the oxide film 16 before etching, and only the portions of the regions adjacent to each other in the X-axis direction of the source region and the drain region remains.

The method of etching the oxide film 16 is dry etching, and the specific conditions of the etching at this time are as follows.

Etching gas: $C_4F_8$
Etching temperature: 20 to 100° C.
Etching time: 5 to 100 sec As the etching gas, instead of $C_4F_8$, $CF_2$, $CF_3$, $C_2F_2$, $C_2F_4$, $C_2F_6$, Ar, $CHF_3$, $O_2$, or $O_3$ can be used, and a mixed gas containing two or more gases selected from an etching gas group consisting of these etching gases can also be used.

Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

Figure 30:
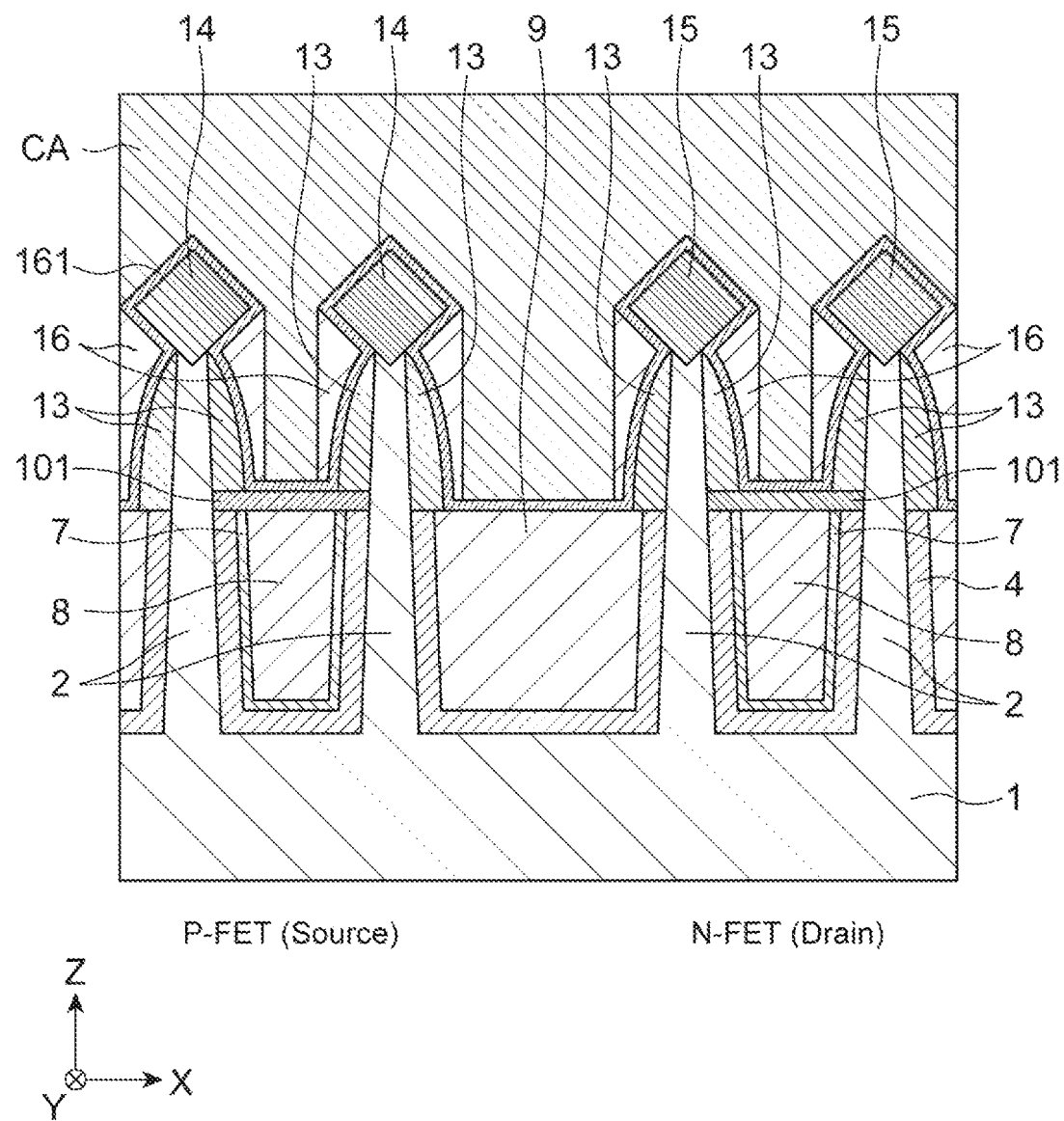
FIG. 30 is a vertical sectional view of the intermediate body of the logic standard cell.

Next, as shown in FIG. 30, a protective film CA as an insulating layer is formed on the entire surface of the substrate. The material of the protective film CA is amorphous carbon, and the forming method is CVD/PECVD or spin coating. The protective film CA is filled between the semiconductor fins 2 adjacent to each other, and the thickness of the protective film CA is set such that the surface thereof is located higher than the top surface of the semiconductor fin 2 and higher than the source region 14 and the drain region 15.

Figure 31:
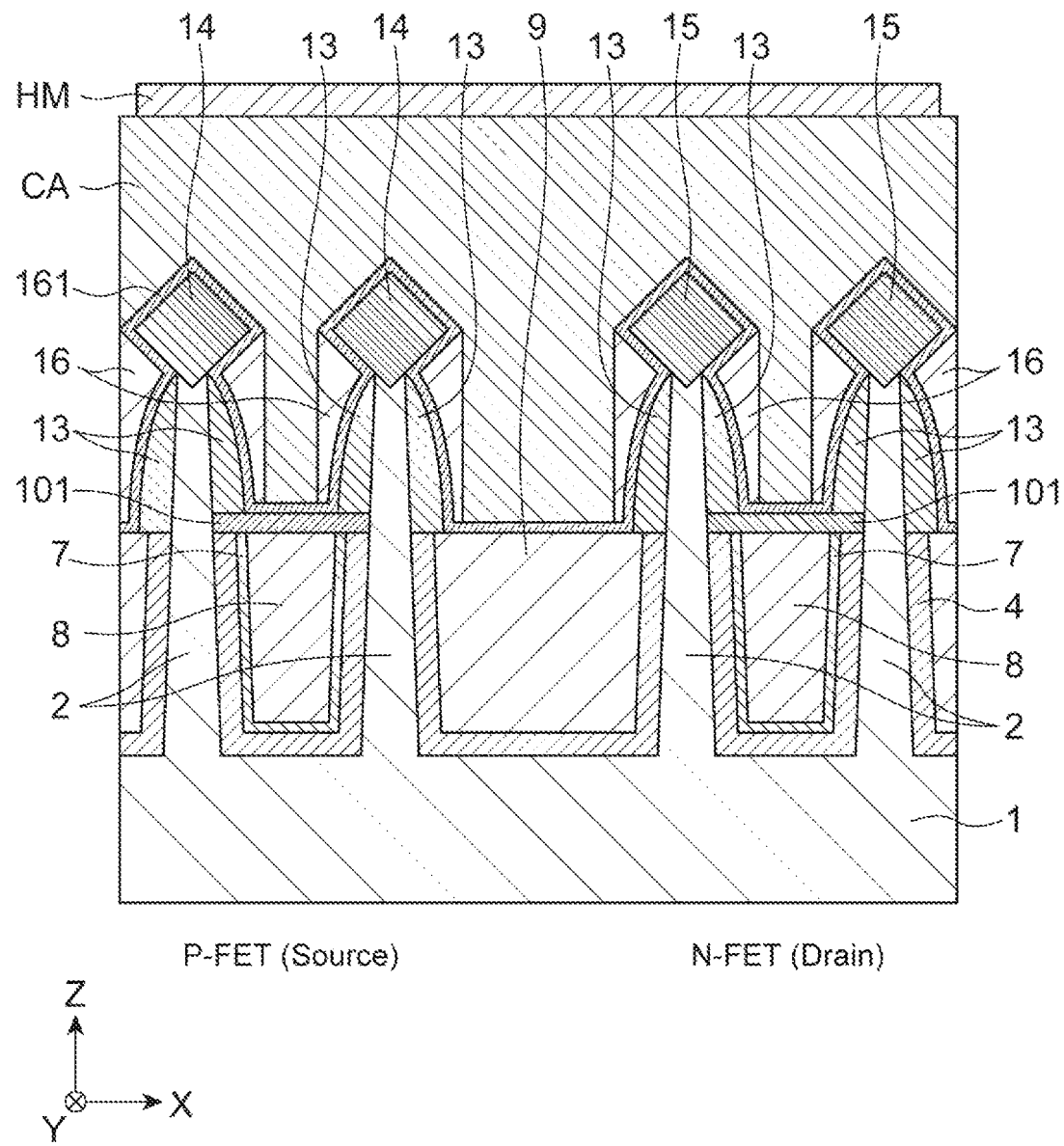
FIG. 31 is a vertical sectional view of the intermediate body of the logic standard cell.

Further, as shown in FIG. 31, a hard mask HM is formed on the protective film CA. As a forming method, a CVD method, a PVD method, or an ALD method at room temperature can be used, and as the material of the hard mask HM a nitride film, a titanium-based film, a silicon-based film, a silicon oxide film, or the like can be used. In this example, a silicon nitride film ($Si_3N_4$) is used.

Figure 32:
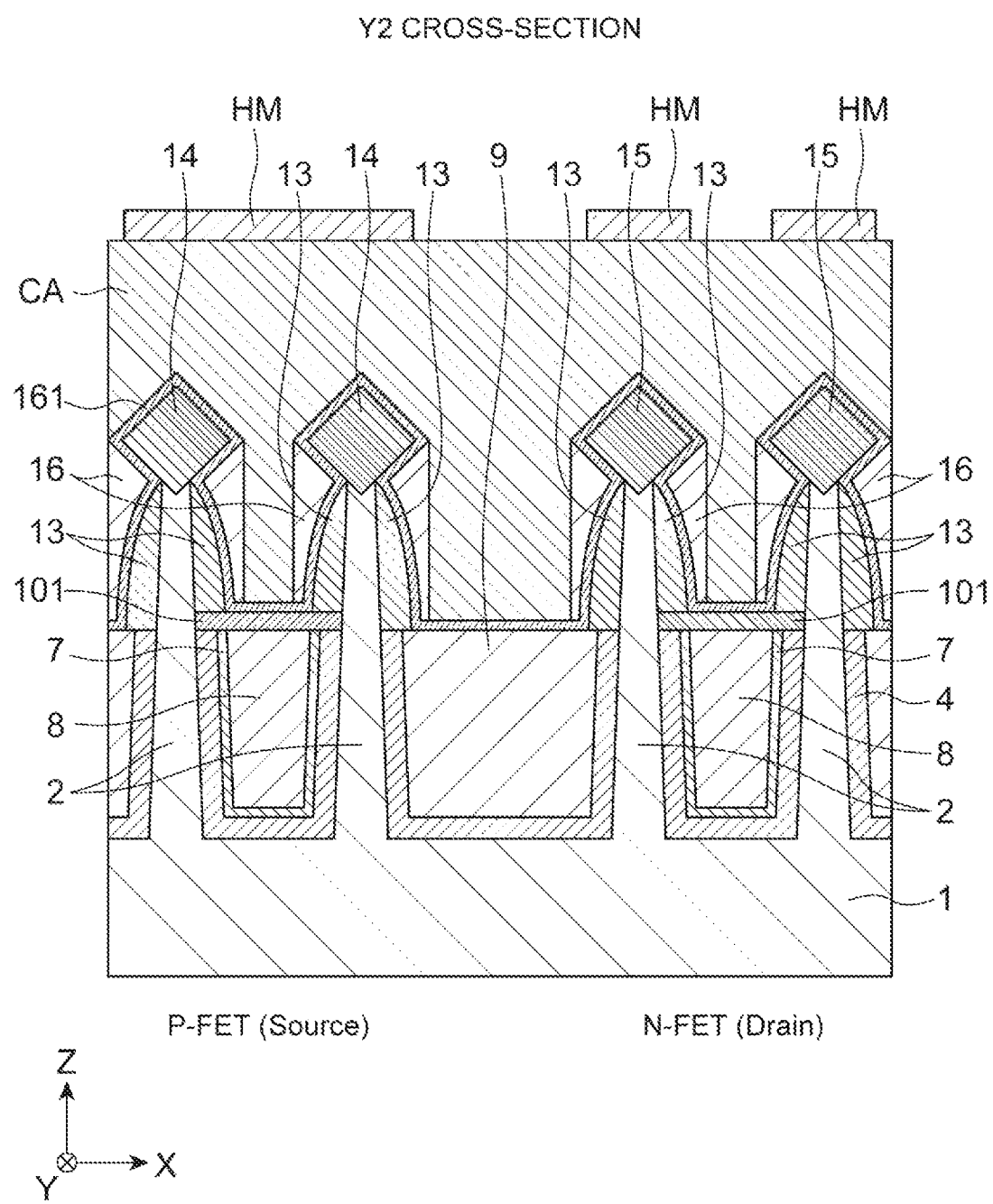
FIG. 32 is a vertical sectional view of the intermediate body of the logic standard cell.
Figure 33:
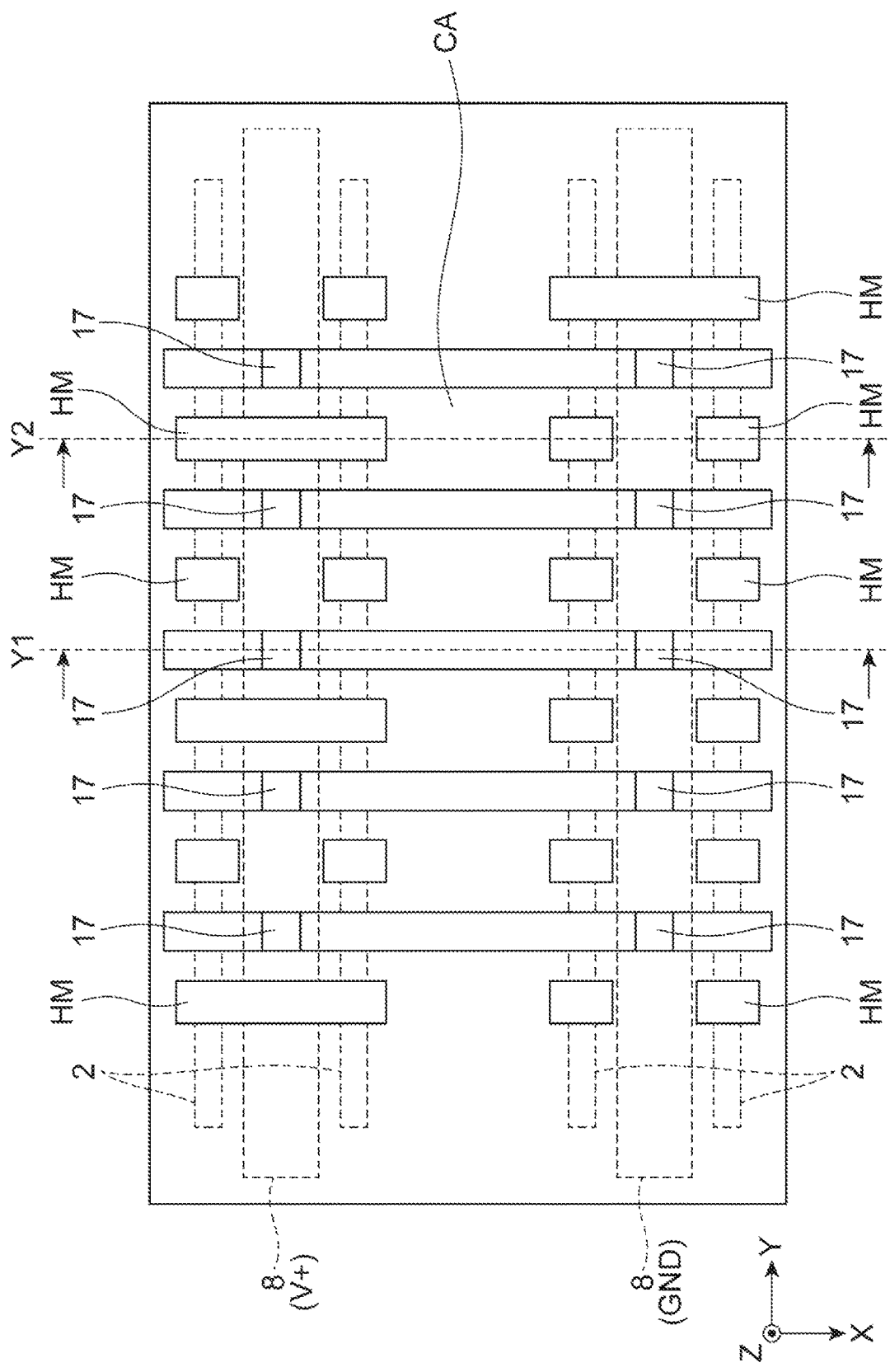
FIG. 33 is a plan view of the intermediate body of the logic standard cell.

Next, as shown in FIG. 32 (Y2 cross-section), the hard mask HM is patterned by etching using photolithography, and when one Y2 cross-section is focused on, a pattern is formed in which the central region in the X direction and the region immediately above the fixed potential line 8 of the N-FET are open (refer to FIG. 33).

Figure 34:
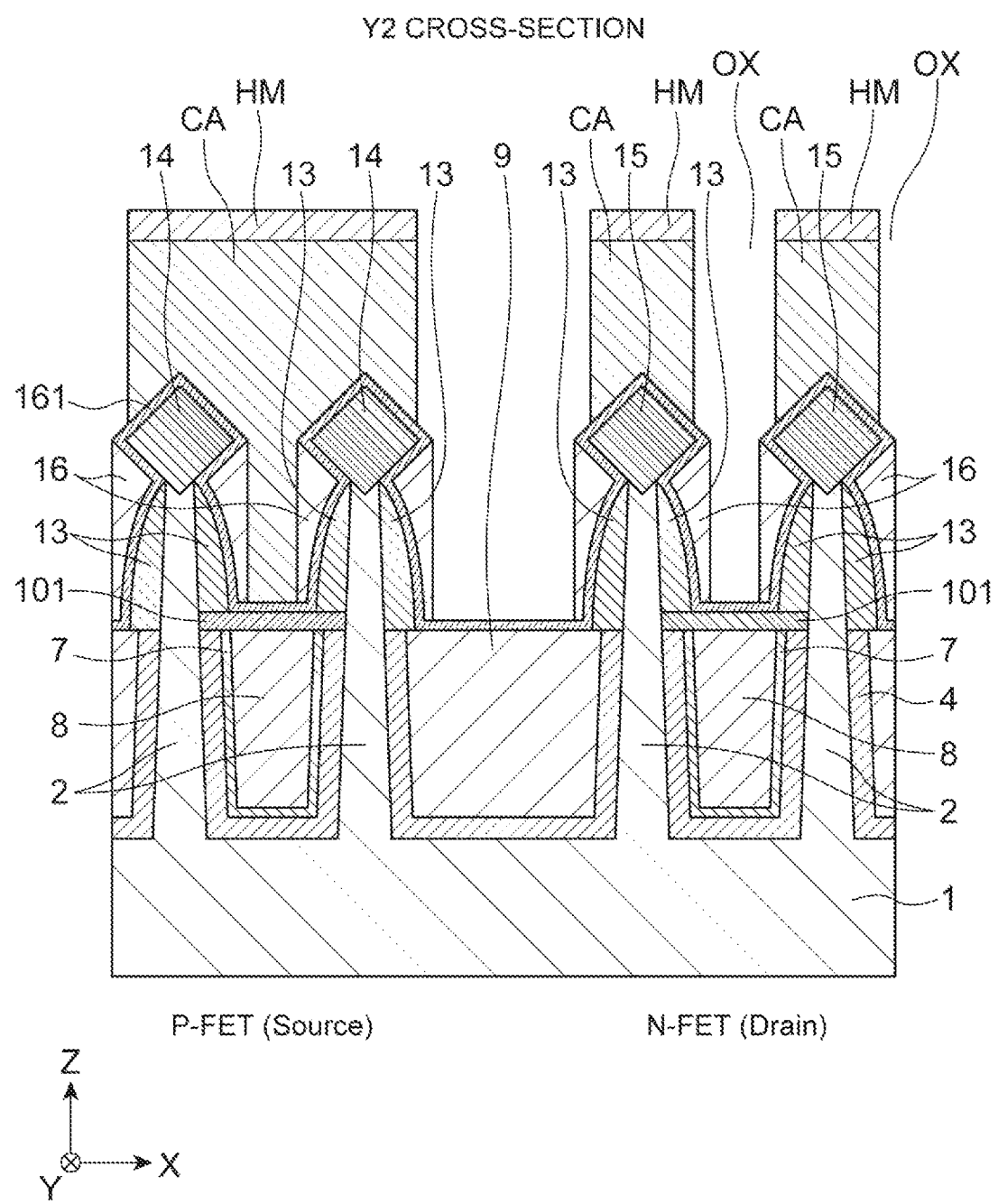
FIG. 34 is a vertical sectional view of the intermediate body of the logic standard cell.

Next, as shown in FIG. 34 (Y2 cross-section), the protective film CA in the region immediately below the opening is removed using the hard mask HM as a mask. As a removing method, a dry etching method such as CCP, ECR, HWP, ICP, or SWP can be used.

Figure 35:
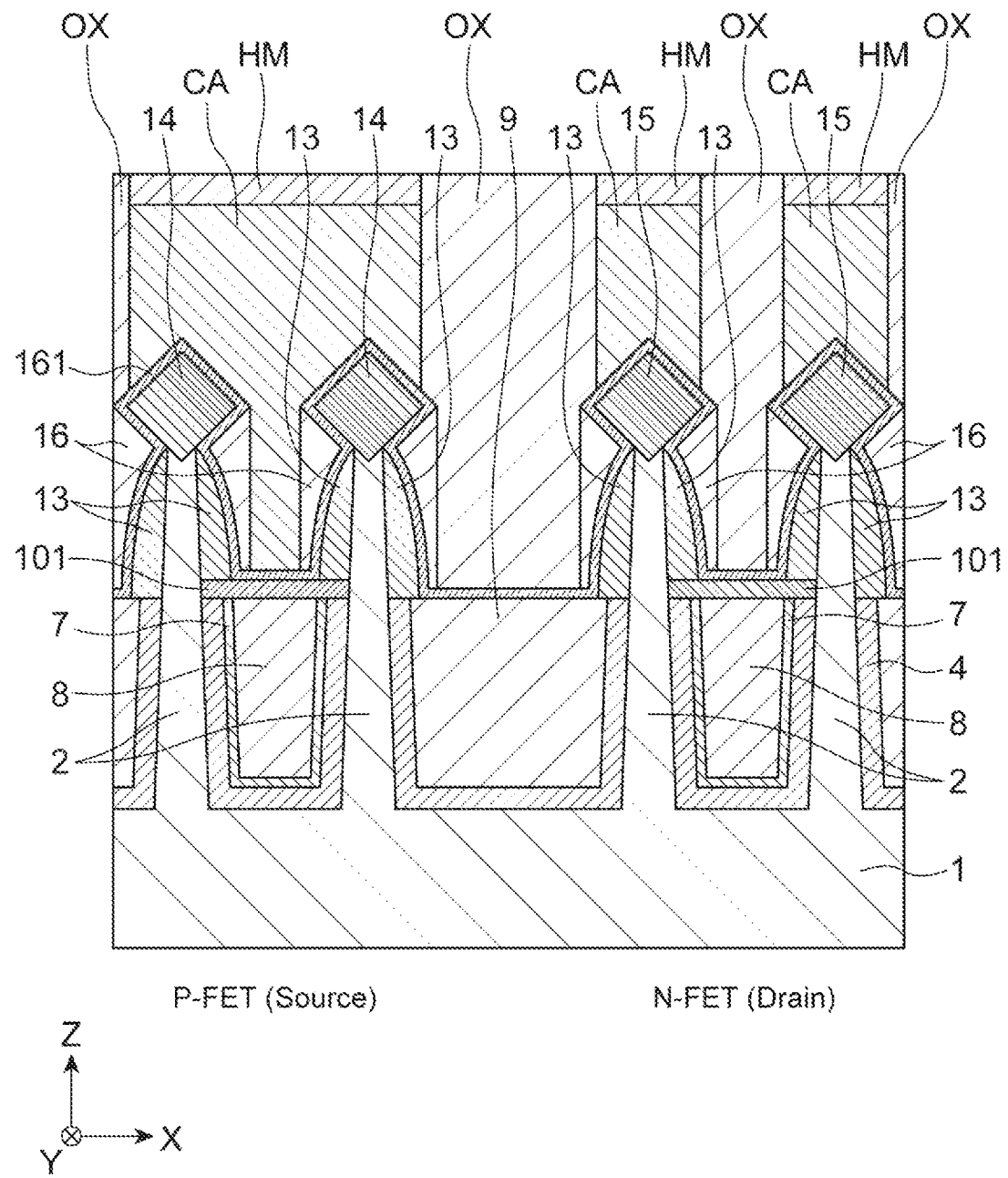
FIG. 35 is a vertical sectional view of the intermediate body of the logic standard cell.

Thereafter, as shown in FIG. 35 (Y2 cross-section), an oxide film OX ($SiO_2$) is formed in the region where the protective film CA is removed, and subsequently, the surface of the oxide film OX is flattened by performing CMP on the oxide film OX. The CMP is stopped on the surface of the hard mask HM.

Figure 36:
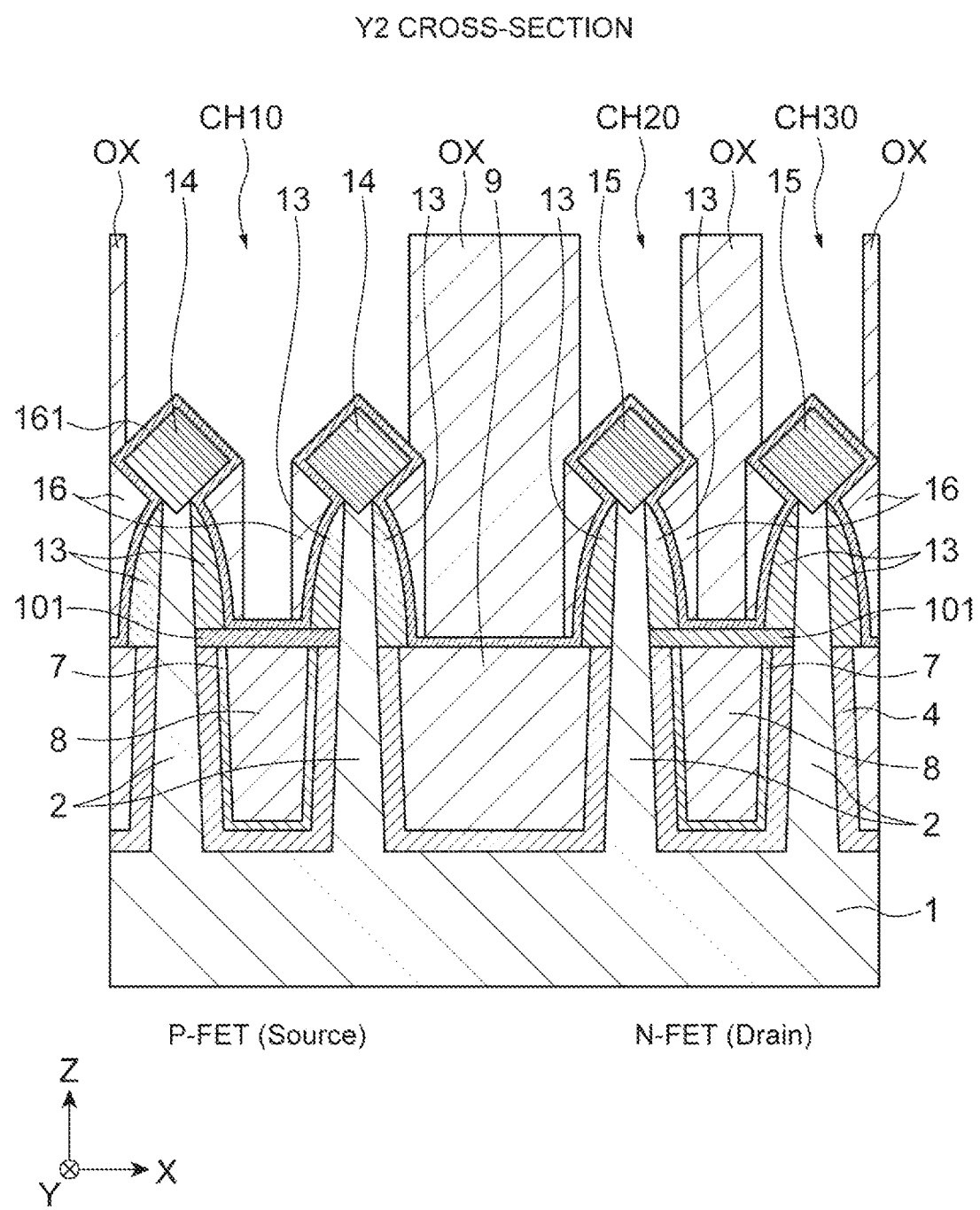
FIG. 36 is a vertical sectional view of the intermediate body of the logic standard cell.

Next, as shown in FIG. 36 (Y2 cross-section), a first contact hole CH10, a second contact hole CH20, and a third contact hole CH30, in which the protective film CA is removed and the nitride films 161 on the surfaces of the fixed potential line 8, the source region 14, and the drain region 15 are exposed, are simultaneously formed. As the removing method, dry etching is used. The first contact hole CH10 is formed at the region where the protective film CA (insulating layer) has been present, in the oxide film OX (insulating layer), and extends toward the source region 14 and the fixed potential line 8, and the second contact hole CH20 and the third contact hole CH30 are formed at the regions where the protective films CA (insulating layers) have been present, in the oxide film OX (insulating layer), and respectively extend to the drain regions 15 at two locations.

With regard to the P-FET, the shape of the contact hole reaching the drain region thereof is the same as the shape of the contact hole reaching the drain region of the N-FET shown in the Y2 cross-section, and similarly, with regard to the N-FET, the shape of the contact hole reaching the source region thereof is the same as the shape of the contact hole reaching the source region of the P-FET in the N-FET3 (refer to FIG. 3) and is the same as the shape of the contact hole reaching the drain region of the N-FET in the Y2 cross-section in other N-FETs (refer to FIG. 33).

More specifically, in the step of forming these contact holes, with regard to the P-FET, the plurality of contact holes include the first contact hole CH10 and the second and third contact holes, the first contact hole CH10 extends toward the source region 14 and the fixed potential line 8, the second and third contact holes respectively extend toward the drain regions at two locations in the same X-Z cross-section of the P-FET, and the first contact hole, the second contact hole, and the third contact hole are formed at the same time.

On the other hand, with regard to the N-FET, the contact holes include the second contact hole CH20 and the third contact hole CH30 in the Y2 cross-section and the first contact hole extending toward the source region of the N-FET3 (refer to FIG. 3), the second contact hole CH20 and the third contact hole CH30 extend toward the drain regions 15 located at two locations on the Y2 cross-section, the first contact hole of the N-FET3 extends toward the source region and the fixed potential line 8 (GND) of the N-FET3, and the first contact hole, the second contact hole, and the third contact hole are formed at the same time. In the N-FETs other than the N-FET3, the first contact hole need only extend toward the source region, and need not extend to the fixed potential line 8.

Figure 39:
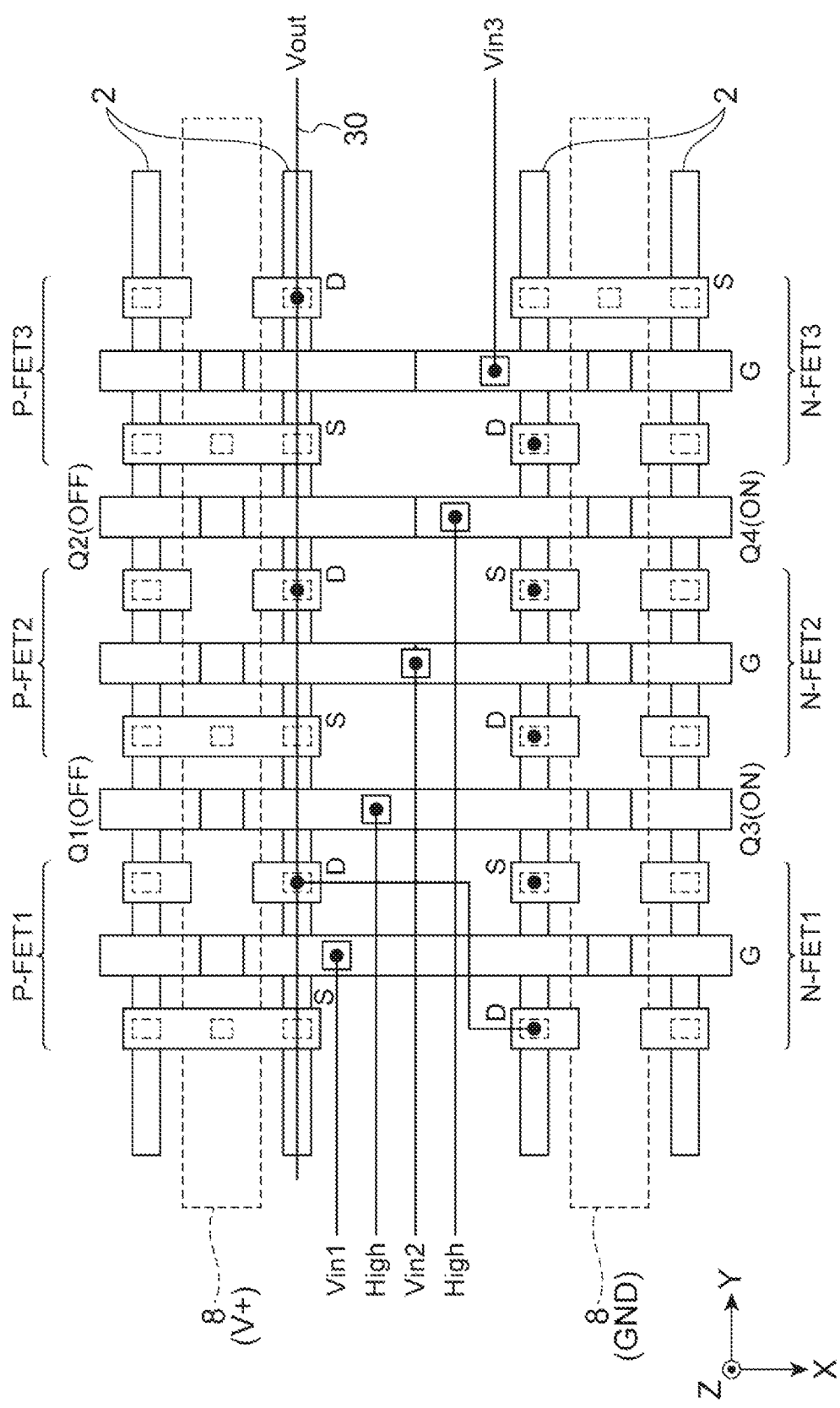
FIG. 39 is a plan view of the intermediate body of the logic standard cell.

Further, in a case where the switch Q4 in FIG. 39 is turned on and used, the second contact hole CH20 and the third contact hole CH30 reaching the drain region in the Y2 cross-section of FIG. 36 may be omitted. However, in a case where the N-FETs adjacent to each other are connected using the upper wiring line, these contact holes are necessary.

The method of etching the hard mask HM and the protective film CA at this time is reactive ion etching (RIE) of dry etching, and the hard mask HM ($Si_3N_4$) and the protective film CA (amorphous carbon) can be consecutively processed by changing the gas which is supplied or conditions. It is also possible to consecutively process the etching of both the hard mask HM and the protective film CA in the container of the same etching apparatus. As the etching apparatus, a capacitively-coupled plasma (CCP) type etching apparatus can be adopted.

The specific conditions for the dry etching of the hard mask HM at this time are as follows.

Etching gas: $CF_4$
Etching temperature: 20 to 100° C.
Etching time: 5 to 120 sec As the etching gas, instead of $CF_4$, $O_2$, $O_3$, $SF_6$, $SF_5$, $SF_4$, $SF_3$, $SF_2$, Ar, or $N_2$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

Further, the specific conditions for the dry etching of the protective film CA are as follows.

Etching gas: CO
Etching temperature: 100 to 350° C.
Etching time: 20 to 60 sec

As the etching gas, instead of CO, $N_2$ or $H_2$ can be used, and a mixed gas containing two or more gases selected from the etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can be adopted, and consecutive etching is possible merely by changing the etching gas or conditions in the same chamber as the etching chamber (container) for the hard mask HM. If processing is possible in the same chamber, productivity is improved. However, in a case where the processing time becomes long, it is also possible to perform processing in different connected chambers in a vacuum environment in consideration of throughput. Further, when the protective film CA is etched by RIE, the sidewalls below the source region and the drain region are the oxide film 16. However, in the ALE, the etching selection ratio between the protective film CA and the oxide film 16 is sufficiently high, and thus the protective film CA is selectively removed.

Figure 37:
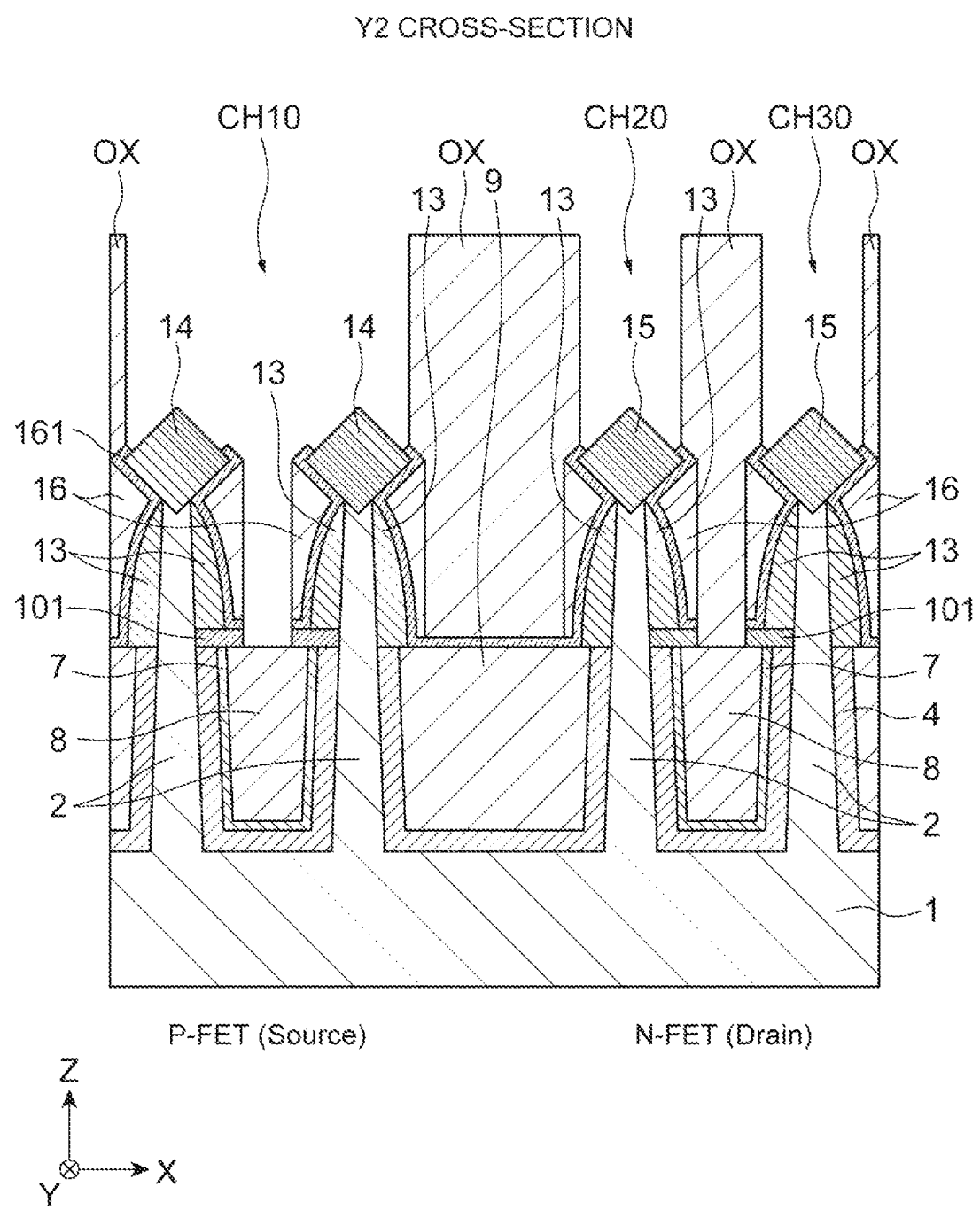
FIG. 37 is a vertical sectional view of the intermediate body of the logic standard cell.

Further, as shown in FIG. 37, apart of the nitride film 161 as an insulating layer which has been formed in advance is removed by etching to expose the source region 14 and the drain region 15, and further, in the Y2 cross-section, the nitride film 101 at the portion on the conductive material 8 which is the fixed potential line on the P-FET side is also removed at the same time as the nitride film 161. The etching method for the nitride film 161 and the nitride film 101 ($Si_3N_4$) is ALE (Atomic Layer Etching), and as an etching apparatus, a capacitively-coupled plasma (CCP) type etching apparatus can be adopted. In this way, the surface of the conductive material 8 as the fixed potential line is exposed, and connection to this becomes possible. In a case of connecting not only the source region of the P-FET but also the source region of the N-NET (refer to FIG. 3) to the fixed potential line, a structure in which FIG. 37 is horizontally inverted may be adopted.

The specific conditions of ALE at this time are as follows, and a first gas and a second gas are alternately supplied onto the surface of the substrate.

Etching gas: $C_5F_8$ as the first gas and $CF_4$ as the second gas

Etching temperature: −20 to 100° C.

Etching time: 30 to 120 sec

As the first etching gas, instead of $C_5F_8$, $C_5HF_9$, $C_4HF_7$, or $C_3HF_5$ can be used, and as the second etching gas, instead of $CF_4$, $C_2F_6$, $C_3F_8$, $CH_3F$, $CH_2F_2$, or $CHF_3$ can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted. The etching of the nitride films 161 and 101 can also be performed in the same chamber (container) in which the etching of the hard mask HM and the protective film CA has been performed. Alternatively, it is also possible to perform processing in different connected chambers in a vacuum environment in consideration of throughput.

Further, as the etching of the nitride film, wet etching can be adopted, and as the etching apparatus, a batch type etching apparatus can be adopted. The specific conditions of the etching at this time are as follows.

Etching liquid: $H_3PO_4$

Etching temperature: 80 to 200° C.

Etching time: 5 to 60 min

Further, in the etching, a mask in which the pattern is formed by photolithography using a photoresist, and etching of a desired region is performed using the mask.

As the etching method for the nitride film 161 and the nitride film 101 ($Si_3N_4$), other plasma etching can also be adopted. For example, it is plasma etching using the following gas species in a CCP type plasma etching apparatus.

Etching gas: $CF_4$

Etching temperature: 20 to 100° C.

Etching time: 5 to 120 sec

As the etching gas, instead of $CF_4$, $O_2$, $O_3$, $SF_6$, $SF_5$, $SF_4$, $SF_3$, $SF_2$, Ar, or $N_2$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

As described above, in the Y2 cross-section, the surface of the conductive material 8 on the left side, which is the fixed potential line, is exposed. Further, the upper surfaces of the source region 14 and the drain region 15 are exposed. However, the conductive material 8 for the ground potential, which is the fixed potential line on the N-FET side, is not exposed.

As described above, the insulating layer in which an opening is formed when the contact hole is formed is composed of insulating layers which include the hard mask HM (nitride film), the protective layer CA (amorphous carbon layer), and the nitride films (161, 101). Further, the insulating layer includes at least a first nitride film (hard mask HM), the protective film CA (amorphous carbon layer), and a second nitride film (nitride films 161 and 101).

Further, the step of forming the contact holes includes a step of etching the first nitride film (hard mask HM) and the protective film CA (amorphous carbon layer), and a step of etching a part of the second nitride film (nitride films 161 and 101). Further, the step of etching the first nitride film (hard mask HM) and the protective film CA (amorphous carbon layer) can be consecutively executed by reactive ion etching (RIE) to improve productivity. Further, by executing the etching of the second nitride film by atomic layer etching, damage to the source and the drain can be minimized. Further, the step of etching the first nitride film (hard mask HM) and the protective film CA (amorphous carbon layer) and the step of etching a part of the second nitride film by atomic layer etching can also be consecutively performed in the same chamber (container). In this way, processing with high productivity and less damage becomes possible.

Figure 38:
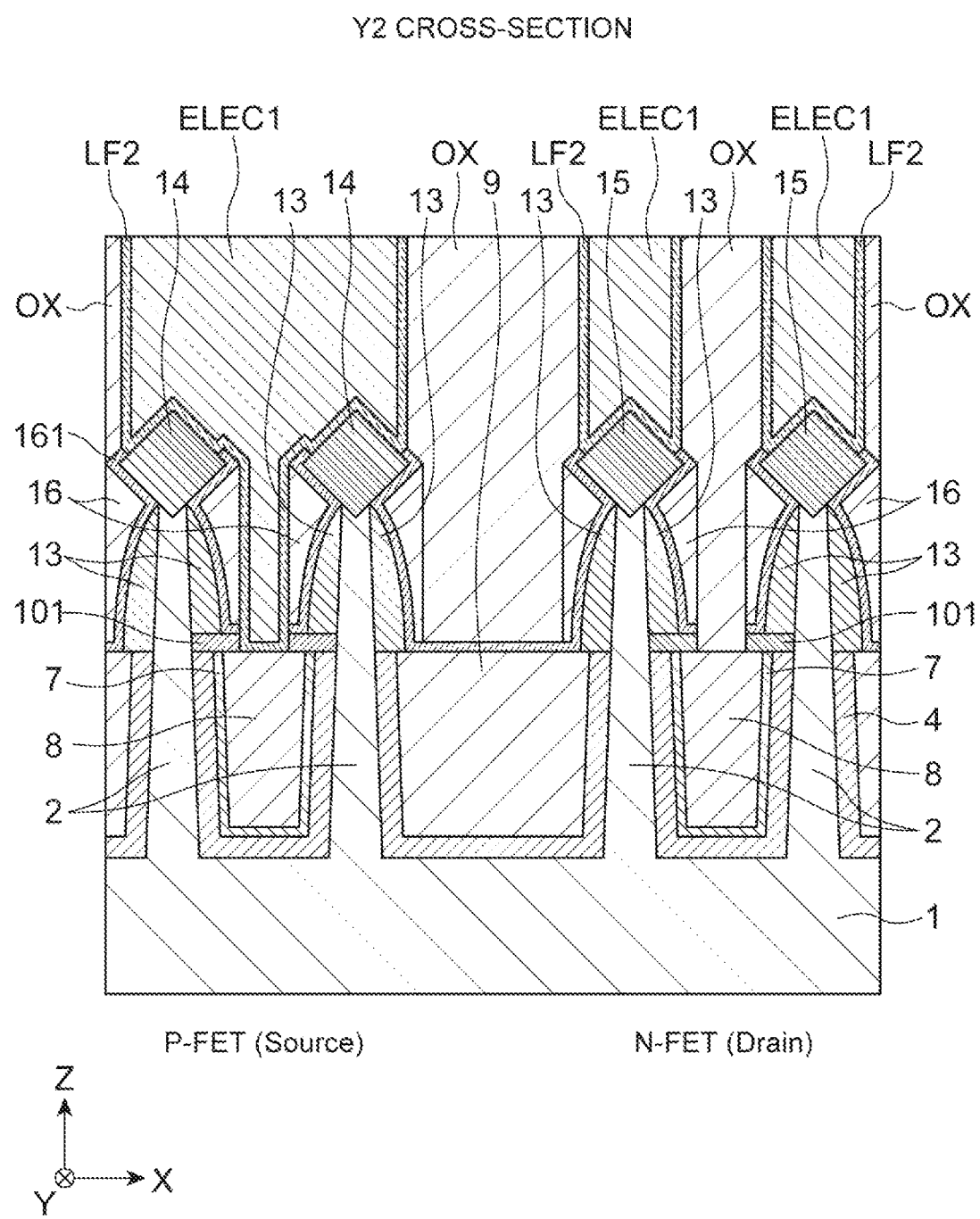
FIG. 38 is a vertical sectional view of the intermediate body of the logic standard cell.

Next, as shown in FIG. 38, after a liner film LF2 (TiN or TaN) is formed on the entire surface of the substrate, the electrode material ELEC1 is formed on the surface of the substrate to cover the entire surface. As the forming method, a CVD method, a PVD method, a plating method, or a coating method can be used. However, a sputtering method can also be used. The liner film LF2 is located at the boundary between the electrode material ELEC1 and the substrate.

In a case where the liner film LF2 made of TiN is formed by a sputtering method, specific forming conditions are as follows.

Material of liner film LF2: TiN

Forming temperature: 200 to 600° C.

Thickness: 0.5 nm to 2.0 nm

As the material of the liner film LF2, instead of TiN, TaN can also be used.

As the electrode material ELEC1, Ru, Co, or W can be used.

In the Y2 cross-section in FIG. 38, a first contact electrode (electrode material ELEC1), a second contact electrode (electrode material ELEC1), and a third contact electrode (electrode material ELEC1) are respectively formed in the first contact hole CH10, the second contact hole CH20, and the third contact hole CH30 in FIG. 37.

The source region 14 and the drain region 15 are electrically connected to the electrode ELEC1 in good condition by annealing at about 450° C. Thereafter, the exposed surface of the electrode material ELEC1 (Ru) filled in the contact hole on the substrate surface is etched back by dry etching or wet etching to remove an excess ruthenium metal R and flatten the surface. If necessary, the substrate surface may also be treated by CMP.

Next, FIG. 5 will be referred to. As shown in FIG. 5, the oxide film 27 ($SiO_2$) is formed on the flattened substrate surface. That is, in the Y2 cross-section, the oxide film 27 is formed on the electrode material ELEC1 and the oxide film OX. The method of forming the oxide film 27 is vapor phase growth, and as a forming apparatus, an ALD apparatus or a CVD apparatus can be adopted.

In a case of using a CVD method, the specific conditions for forming the oxide film 27 are as follows.
Raw material: TEOS (tetraethyl orthosilicate), $O_2$
Forming temperature: 400 to 900° C.
Forming time: 5 to 1800 sec The oxide film 16 can also be formed by using an ALD method, a PVD method, or spin coating. The forming temperature in the CVD method can be set to be in a range of 300 to 1200° C., and instead of $O_2$, $O_3$ can also be used. Perhydropolysilazane can be used in a coating method by spin coating.

Next, a contact hole is formed in the oxide film 27, and the contact electrode 28 is formed in the contact hole. The contact hole is formed by forming a mask on the oxide film 27 and performing etching through the mask. This mask is formed by applying a photoresist on the exposed surface of the oxide film 27, and forming openings only in the regions on the source and drain regions and the gate electrode 21 in an N-FET formation planned region by exposing and developing the photoresist. The oxide film 27 is etched through this mask, and the etching is stopped at the point in time when the electrode material is exposed. As the method of etching the oxide film 27 ($SiO_2$) at this time, dry etching may be used as in the oxide film 16 and the oxide film 9 described above, and as the etching apparatus, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, or a surface wave plasma (SWP) type etching apparatus can also be adopted.

The material of the contact electrode 28 is ruthenium, Co, or W, and the forming method can be a CVD method or a PVD method, the forming temperature is in a range of 200 to 600° C., and deposition of the material is ended at the point in time when the contact hole is filled with this material. Thereafter, the surface of the oxide film 27 is subjected to CMP to remove an excess electrode material.

Next, SiOC that is Low-k (low dielectric constant material) is formed as the interlayer insulating film 29 on the oxide film 27, a line-shaped recess portion extending in the Y-axis direction is formed in the SiOC, and the signal wiring 30 is formed in the line-shaped recess portion. If an interlayer insulating film material having a low dielectric constant is used, an inter-wiring capacitance can be reduced. Although $SiO_2$ is known as the material of the interlayer insulating film, a relative dielectric constant is in a range of about 4.2 to 4.0, and as the Low-k material, a relative dielectric constant of 3.0 or less is preferable. As a Low-k film, a PE-CVD (Plasma Enhanced-Chemical Vapor Deposition) carbon-added silicon oxide film (SiOC film) having a relative dielectric constant k of 2.9 is known.

The method of forming the interlayer insulating film 29 is a PE-CVD method, and as a forming apparatus, a PE-CVD apparatus can be adopted.

The specific conditions for forming the interlayer insulating film 29 (SiOC film) are as follows.
Raw materials: $(CH_3)_3Si-NH-Si(CH_3)_3$ (hexamethyldisilazane (HMDS)), $O_2$
Forming temperature: 400 to 1200° C.
Forming time: 5 to 60 min The method of etching SiOC configuring the interlayer insulating film is dry etching, and as an etching apparatus, a capacitively-coupled plasma (CCP) type etching apparatus can be adopted. The specific conditions of the etching are as follows.
Etching gas: $C_4F_8$
Etching temperature: 20 to 100° C.
Etching time: 5 to 300 sec As the etching gas, instead of $C_4F_8$, $CF_2$, $CF_3$, $C_2F_2$, $C_2F_4$, $C_2F_6$, Ar, $N_2$, $O_2$, or $O_3$ can be used, and a mixed gas containing two or more gases selected from an etching gas group consisting of these etching gases can also be used. Further, for this etching, in addition to the CCP type etching apparatus, an electron cyclotron resonance plasma (ECR plasma) type etching apparatus, a helicon wave plasma (HWP) type etching apparatus, an inductively-coupled plasma (ICP) type etching apparatus, and a surface wave plasma (SWP) type etching apparatus can also be adopted.

The material of the signal wiring 30 is Cu, the forming method is plating, the forming temperature is room temperature, and the deposition of the material is ended at the point in time when the signal wiring is filled with this material. Thereafter, the surface of the interlayer insulating film 29 is subjected to CMP to remove an excess material.

In this way, the electrode material ELEC1 (Ru) formed on the drain region and the source region on the N-FET side is connected to the signal wiring 30 through the contact electrode 28, and the gate electrode 21 is connected to another signal wiring 30 through the contact electrode 28. The number of signal wirings 30 is plural and can be connected to various elements, as necessary. In the Y2 cross-section, the source region in the P-FET and the drain region in the N-FET are shown. However, the cross-sectional structure is the same in the X-Z cross-section passing through the source region in the P-FET. Further, except for the N-FET3, the X-Z cross-section passing through the drain region of the P-FET and the source region of the N-FET is the same as the cross section passing through the drain region of the N-FET formation region in the Y2 cross-section. Further, the X-Z cross-section passing through the source region of the N-FET 3 is a cross section in which the left and right sides of the Y2 cross-section are reversed, and the source region of the N-FET3 is connected to the fixed potential line (GND) made of the conductive material 8.

In this way, as shown in FIGS. 3 and 4, the P-FET1, the P-FET2, and the P-FET3, which are P-type fin type transistors, and the DP-FET1, the DP-FET2, and the DP-FET3, which are P-type fin type dummy FETs, are formed, and the N-FET1, the N-FET2, and the N-FET3, which are N-type fin-type transistors, and the DN-FET1, the DN-FET2, and the DN-FET3, which are N-type fin-type dummy FETs, are formed.

In FIG. 39, the input signals Vin1, Vin2, and Vin3, and the high-level control signal (High) are input to the signal wiring 30 in FIG. 39, and the output signal Vout is extracted from the signal wiring 30 connected to the drain regions of the P-FET1, the P-FET2, and the P-FET3. However, the drain region of the N-FET1 is electrically connected to the signal wiring 30 for the output signal Vout. Different signal wirings 30 are connected to the gate electrodes of the transistors and the gate electrodes of the switches Q1 to Q4, respectively, and therefore, different signals or biases can be provided to these gate electrodes.

As described above, in the etching in FIGS. 36 to 38, a control device of a plasma processing apparatus comprises the method for manufacturing a semiconductor device that includes a semiconductor fin including a source region and a drain region which configure a field effect transistor, and a fixed potential line (conductive material 8) provided in parallel to the semiconductor fin, the method including: a first step of preparing an intermediate body in which the insulating layer CA is provided on the source region, the drain region, and the fixed potential line; and a second step of simultaneously forming contact holes, which respectively extend to the source region, the drain region, and the fixed potential line, in the insulating layer CA. Further, this method further includes a step of forming contact electrodes (electrode materials ELEC1 (FIG. 38)) in the plurality of contact holes, respectively.

Even if all the manufacturing conditions described above are changed by ±15%, it is possible to manufacture a product.

Figure 40:
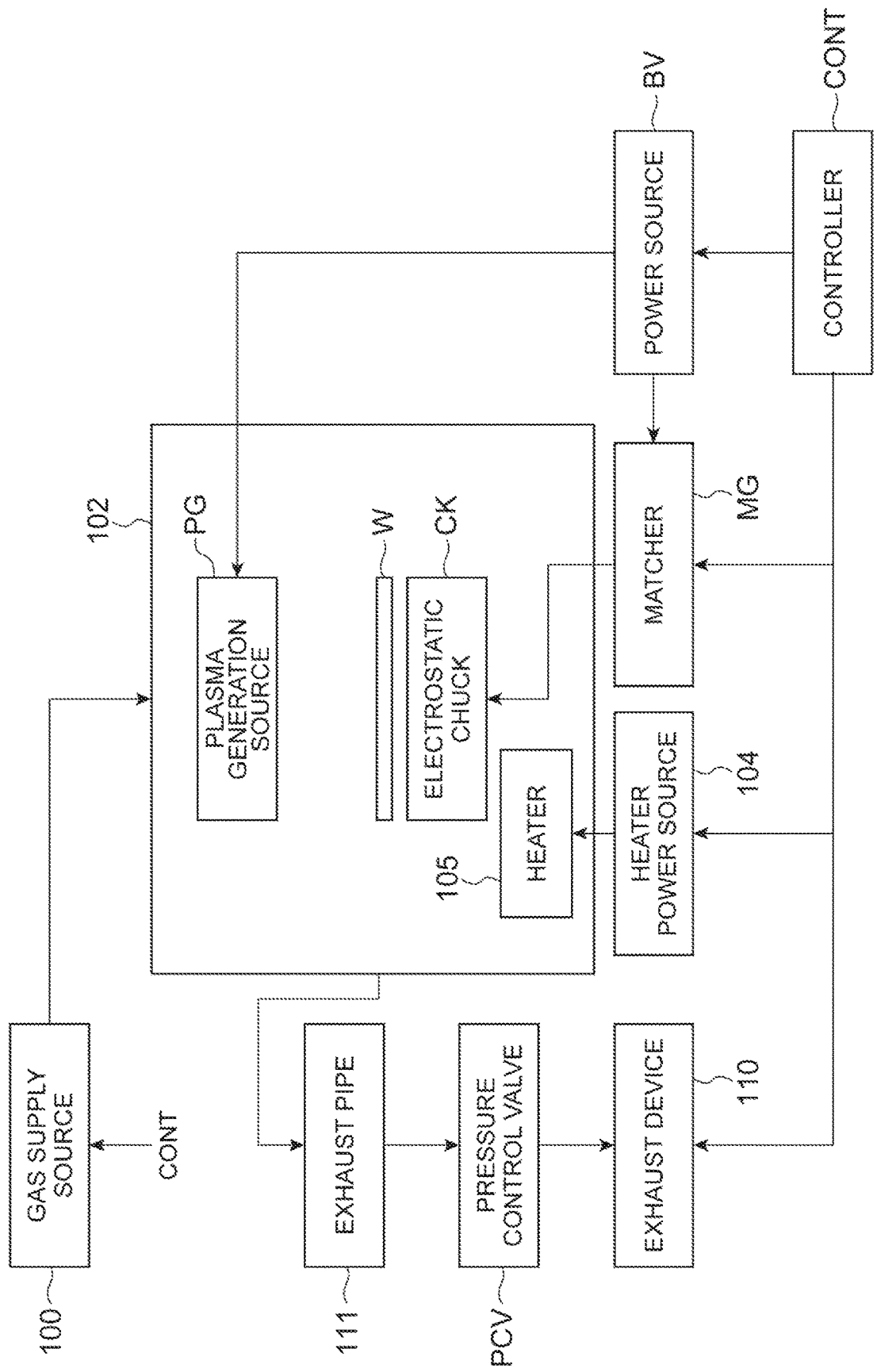
FIG. 40 is a block diagram of an etching apparatus.

FIG. 40 is a block diagram of an etching apparatus using plasma.

A controller CONT controls a power source BV to generate plasma from a plasma generation source PG The generated plasma is plasma of an etching gas supplied from a gas supply source 100 into a processing container 102, and the gas amount of the etching gas is controlled by the controller CONT. The plasma gas moves toward a substrate W (wafer) and etches various materials on the substrate W. The substrate W is fixed by an electrostatic chuck CK, and the temperature of the substrate W is adjusted by a heater 105. The electrostatic chuck CK is connected to the ground in the controller CONT through a matcher MG and the heater 105 is connected to the controller CONT through a heater power source 104. An exhaust pipe 111 is connected to the processing container 102, and is connected to an exhaust device 110 (vacuum pump) through a pressure control valve PCV.

The apparatus shown in the drawing functions as, in addition to a CCP type etching apparatus, an electron cyclotron resonance plasma (ECR plasma) type plasma processing apparatus, a helicon wave plasma (HWP) type plasma processing apparatus, an inductively-coupled plasma (ICP) type plasma processing apparatus, and a surface wave plasma (SWP) type plasma processing apparatus, according to the form of the plasma generation source PG and can perform the etching described above.

As described above, in the etching in FIG. 12, the control device of the plasma processing apparatus performs control to execute a first step of an intermediate body which is provided with a first semiconductor fin (for a P-FET) and a third semiconductor fin (for a P-FET) provided to be erected from the substrate, and in which the conductive material 8 for the fixed potential line is provided to a position higher than any of the top surfaces of the first and third semiconductor fins in the region between the first and third semiconductor fins adjacent to each other and a protective material (protective film 5) is provided on a region outside the region between the first and third semiconductor fins, and a second step of etching the conductive material 8 to a position lower than any of the top surfaces of the first and third semiconductor fins to remove the conductive material on the protective material (protective film 5) and causing the conductive material 8 to remain in the region between the first and third semiconductor fins, and the control method of the present embodiment is executed by such a control device.

In the control of the etching of the conductive material, in a case of using a mixed gas of oxygen ($O_2$) and $Cl_2$ as the etching gas for plasma processing, control is performed such that the ratio of $Cl_2$, that is, the value (%) of $Cl_2/(O_2+Cl_2) \times 100$ is in a range of 1% to 20%. Preferably, control is performed such that the value is in a range of 7% to 15%. More preferably, control is performed such that the value is in a range of 9% to 11%.

In other words, in a case where the second conductive material configuring the fixed potential line is at least one metal selected from the group consisting of Co, W, and Ru, the etching gas for the second conductive material is a mixed gas of oxygen ($O_2$) and $Cl_2$, and it is preferable that the flow rate ratio of the $Cl_2$ gas to the total gas, that is, the ratio of the volume molar concentration $C(Cl_2)$ (mol/L) of the $Cl_2$ gas to the volume molar concentration $C(O_2+Cl_2)$ (mol/L) of the mixed gas in the unit volume in the processing container satisfies the following inequality.

$1\% \leq C(Cl_2)/C(O_2+Cl_2) \times 100(\%) \leq 20\%$, or more preferably
$9\% \leq C(Cl_2)/C(O_2+Cl_2) \times 100(\%) \leq 11\%$ In these cases, it is considered that if it falls below the lower limit, there is a tendency that a problem of lowering the etching rate occurs, and if it exceeds the upper limit, there is a tendency that a problem of impairing the selectivity occurs, and since a desired etching rate and desired selectivity can be obtained at the same time within the above range, there is the effect that these problems are less likely to occur.

According to this control method, in the semiconductor device that includes the fin-type FETs, the power rail can be easily formed because of self-alignment.

According to this manufacturing method, in the semiconductor device that includes the fin-type FETs, the conductive material embedded between the semiconductor fins is self-aligned by the semiconductor fins, and therefore, the power rail composed of a fixed potential line made of a conductive material can be easily formed.

Further, in FIG. 12, the conductive material includes a first conductive material (liner film 7) separated from the first semiconductor fin 2 by a first distance d1 smaller than a second distance d2, and a second conductive material (conductive material 8) separated from the first semiconductor fin 2 by the second distance d2, and the first conductive material is an etching barrier film having higher etching resistance than the second conductive material with respect to an etching gas for the second conductive material. Since the first conductive material is an etching barrier film, it functions as an etching stopper, and thus the semiconductor fin 2 is protected by the first conductive material (liner film 7).

The first conductive material 7 is TiN or TaN, the second conductive material 8 is at least one metal selected from the group consisting of Co, W, and Ru, and the etch-back gas for the second conductive material 8 is (1) $CF_4$, or (2) a mixed gas of oxygen and $Cl_2$. In this case, the mixed gas of oxygen ($O_2$) and $Cl_2$ can etch the above metal such as Ru selected. However, metal nitride such as TiN (titanium nitride) or TaN (tantalum nitride) has etching resistance with respect to this mixed gas. In the case of these metals, it is possible to achieve both the etching stopper function and the electrical conductivity which is required for the fixed power source line. In particular, in a case of using Ru as the conductive material, there is the effect of low resistance.

Further, the manufacturing method described above includes a first step of preparing an intermediate body which is provided with a pair of semiconductor fins 2 provided to be erected from a substrate, and in which the conductive material 8 for the fixed potential line to which the source region of the semiconductor fin 2 is connected is provided to a position higher than any of the top surfaces of the semiconductor fins 2 in the region between the semiconductor fins 2 adjacent to each other and a protective material is provided on a region outside the region between the semiconductor fins 2, and a second step of etching the conductive material 8 to a position lower than any of the top surfaces of the semiconductor fins 2 to remove the conductive material on the protective material and causing the conductive material to remain in the region between the semiconductor fins.

Further, the semiconductor device (logic standard cell) described above includes a first fin group (P-FET) composed of a pair of semiconductor fins 2, and a second fin group (N-FET) separated from the first fin group and composed of a pair of semiconductor fins, in which the first fin group (P-FET) includes a first semiconductor fin that configures a fin-type P-type field effect transistor which includes a source region, a gate region, and a drain region, the second fin group (N-FET) includes a second semiconductor fin that configures a fin-type N-type field effect transistor which includes a source region, a gate region, and a drain region, and the fixed potential line 8 which includes the conductive material 8 embedded to a position lower than any of the top surfaces of the semiconductor fins and is connected to the source region of the semiconductor fin 2 is provided in a region between the semiconductor fins 2 of the first fin group (P-FET).

In this semiconductor device, the fixed potential line can be easily formed, and a semiconductor device with a small cell height can be manufactured. Therefore, power consumption can be reduced and operating speed can be increased.

REFERENCE SIGNS LIST

2 Semiconductor fin
7 Liner film
8 Conductive material
9 Oxide film
11 Gate electrode
13 Sidewall
CH10 First contact hole
CH20 Second contact hole
CH30 Third contact hole
CA Protective film (amorphous carbon layer: insulating layer)
HM Hard mask (first nitride film: insulating layer)
161 Nitride film (second nitride film: insulating layer)
29 Interlayer insulating film
30 Signal wiring

The invention claimed is:

1. A method for manufacturing a semiconductor device the method comprising:
   preparing an intermediate body in which an insulating layer is provided on a source region of a semiconductor fin, a drain region of the semiconductor fin, and a fixed potential line parallel to the semiconductor fin; and
   simultaneously forming contact holes extending toward the source region, the drain region, and the fixed potential line, in the insulating layer, wherein
   the insulating layer comprises at least a first nitride film, an amorphous carbon layer, and a second nitride film.

2. The method for manufacturing a semiconductor device according to claim 1, wherein
   in the simultaneously forming contact holes,
   the contact holes include a first contact hole and a second contact hole;
   the first contact hole extends toward the source region and the fixed potential line;
   the second contact hole extends toward the drain region; and
   the first contact hole and the second contact hole are formed at the same time.

3. The method for manufacturing a semiconductor device according to claim 1, further comprising
   forming contact electrodes in the contact holes, respectively.

4. The method for manufacturing a semiconductor device according to claim 1, wherein the forming the contact holes includes:
   etching the first nitride film and the amorphous carbon layer, and
   etching a part of the second nitride film.

5. The method for manufacturing a semiconductor device according to claim 4, wherein
   the etching of the first nitride film and the amorphous carbon layer is performed by executing reactive ion etching (RIE); and
   the etching of a part of the second nitride film is performed by executing atomic layer etching.

6. The method for manufacturing a semiconductor device according to claim 4, wherein
   the etching of the first nitride film and the amorphous carbon layer and the etching of a part of the second nitride film are executed in the same container.

* * * * *